(12) United States Patent
Petrovic

(10) Patent No.: US 7,078,987 B1
(45) Date of Patent: Jul. 18, 2006

(54) NARROW BAND-PASS TUNED RESONATOR FILTER TOPOLOGIES HAVING HIGH SELECTIVITY, LOW INSERTION LOSS AND IMPROVED OUT-OF-BAND REJECTION OVER EXTENDED FREQUENCY RANGES

(75) Inventor: Branislav A. Petrovic, La Jolla, CA (US)

(73) Assignee: Broadband Innovations, Inc., San Diego, CA (US)

( * ) Notice: Subject to any disclaimer, the term of this patent is extended or adjusted under 35 U.S.C. 154(b) by 0 days.

(21) Appl. No.: 09/408,826

(22) Filed: Sep. 29, 1999

Related U.S. Application Data

(63) Continuation-in-part of application No. 09/039,988, filed on Mar. 16, 1998, now Pat. No. 6,215,374.

(51) Int. Cl.
*H03H 7/09* (2006.01)

(52) U.S. Cl. ........................... 333/177; 336/200
(58) Field of Classification Search ................. 333/177, 333/178, 204, 205; 336/200
See application file for complete search history.

(56) References Cited

U.S. PATENT DOCUMENTS

| | | | | | |
|---|---|---|---|---|---|
| 1,954,943 | A | * | 4/1934 | Norton ........................ | 333/178 |
| 2,282,113 | A | * | 5/1942 | Brailsford ................... | 333/178 |
| 2,457,774 | A | * | 12/1948 | Cawein ....................... | 333/178 |
| 4,035,695 | A | * | 7/1977 | Knutson et al. ......... | 336/200 X |
| 5,898,403 | A | * | 4/1999 | Saitoh et al. ........... | 333/204 X |

FOREIGN PATENT DOCUMENTS

| DE | 2738-613 | * | 3/1979 | ................. | 333/168 |
|---|---|---|---|---|---|
| JP | 5-347528 | * | 12/1993 | ................. | 333/177 |

\* cited by examiner

*Primary Examiner*—Justin P. Bettendorf
(74) *Attorney, Agent, or Firm*—Robert C. Strawbrisch

(57) ABSTRACT

A tuned resonator circuit topology is disclosed that permits implementation of narrow band-pass filters having high loaded Q and optimal coupling (for low insertion loss) using a parallel tuned resonator topology at frequencies in the 1 to 2 GHz range and beyond. The topology consists of a mirror image of the parallel tuned circuit about the signal line of a conventional parallel tuned circuit to effect a cancellation of virtually all of the induced currents between the inductive elements of the resonators. This reduction in induced currents reduces the magnetic coupling between the resonators, thereby offsetting the increase in overall coupling between the resonators as frequency increases, and thereby serves to maintain optimal coupling between the resonators as the frequency of operation increases. Moreover, the mirror image topology increases the parallelism between the inductive elements in the resonators, thereby decreasing the inductance values and permitting an increase in capacitance values. Increasing the capacitance values of the resonators effectively offsets the decrease in the loaded Q as frequency is increased. The topology works for any number of parallel resonators. As the resolution of the manufacturing process decreases (e.g. from printed circuit board to integrated circuit processes), the range of operating frequencies scales with the increase in resolution.

20 Claims, 43 Drawing Sheets

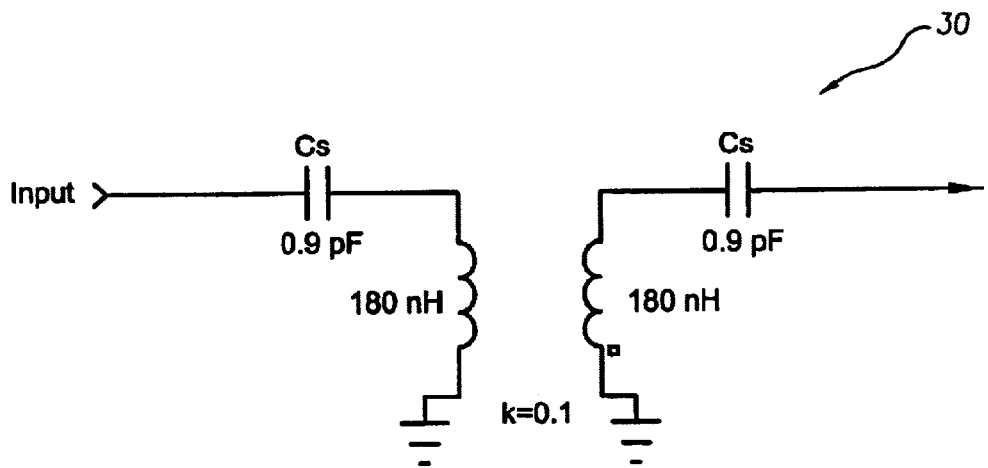
FIG. 3 *(Prior Art)*
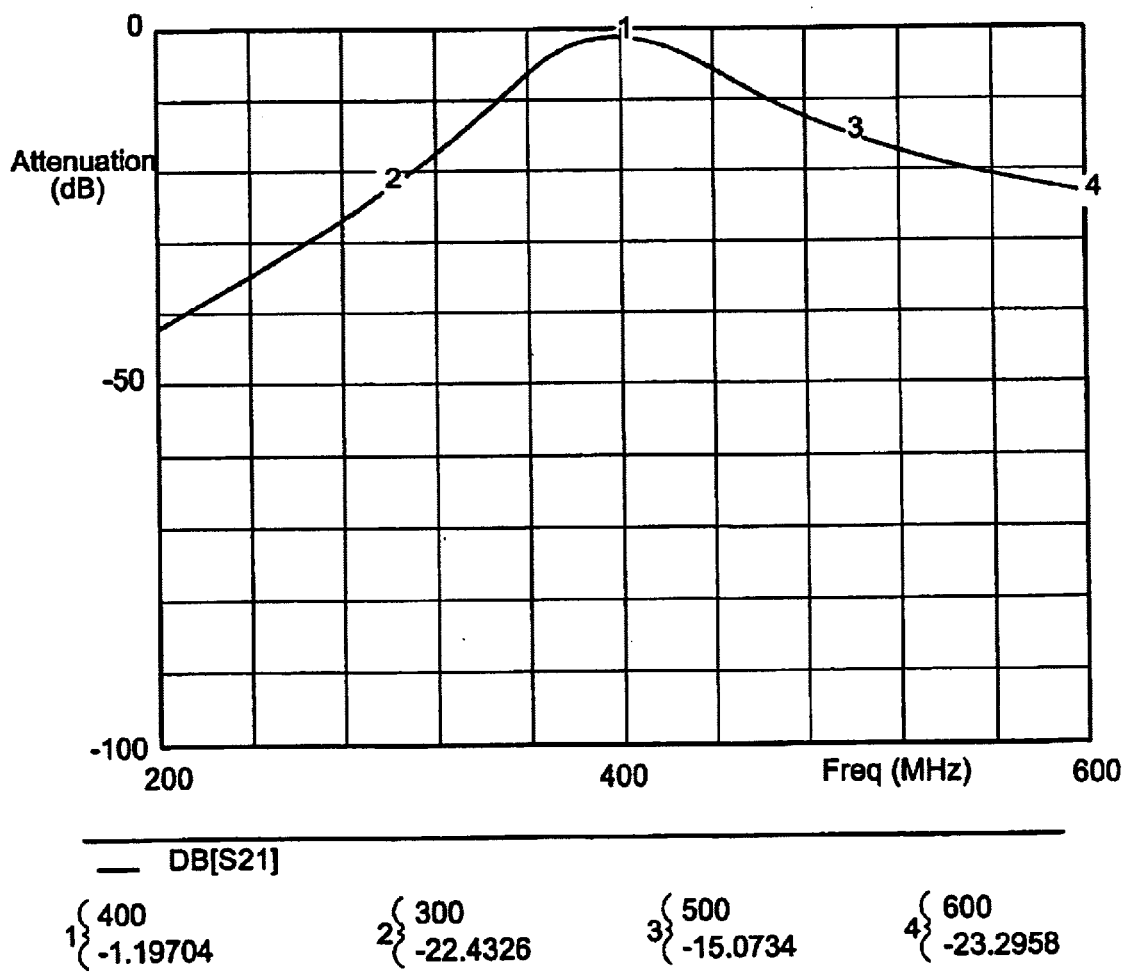
FIG. 4A *(Prior Art)*

Multistrip_coupled microstrip
line(2 resonators, 3 lines each)
Width W=2 mm, Length L=5.5 mm
Gaps:S1=S2=S4=S5=3.45 mm
S3 = 3 mm
Dielectric: er=4.65, tand=0.001
Board thickness (hight) H=1.5mm Multistrip_coupled microstrip
line(2 resonators, 3 lines each)
Width W=2 mm, Length L=5.5 mm
Gaps:S1=S2=S4=S5=3.85 mm
S3 = 4 mm
Dielectric: er=4.65, tand=0.001
Board thickness (hight) H=1.5mm

| | 1 { 400 | 2 { 199 | 3 { 601 | 4 { 700 |
| --- | --- | --- | --- | --- |
| | { -0.450828 | { -18.845 | { -16.7906 | { -24.0876 |

| Equivalent Inductance of Micro-Strip transmission lines used in example filters | | | | | |
|---|---|---|---|---|---|
| Dielectric constant = 4.65; Height = 1.5mm; Copper thickness: 0.018mm | | | | | |
| Filter Example # | Filter Center Frequency (MHz) | Length of uStrip line (mm) | Width of uStrip line (mm) | Percentage of wave-length (%) | Equivalent Inductance of uStrip line (nH) |
| 4 | 70 | 12.25 | 1.5 | 0.6 | 6.1 |
| 5 | 400 | 4 | 1 | 1.1 | 2.4 |
| 6 | 500 | 3.9 | 3 | 2.3 | 1.3 |
| 7 | 400 | 5.36 | 3 | 1.5 | 1.8 |
| 8 (multiple microstrip lines connected in parallel) | 400 | 5.5 | 3 lines connected in parallel each 2mm wide | 1.8 | (2.4 nH each) 0.72nH total (see note) |
| 9 | 400 | 29.4 | 2 | 8.5 | 14 |
| 10 (multiple microstrip lines connected in parallel) | 400 | 5.5 | 3 lines connected in parallel each 2mm wide | 1.5 | (2.4 nH each) 0.72nH total (see note) |
| Note: Adding more microstrip lines connected in parallel (multistrip lines), very low inductance values, in order of 0.5 nH, of high accuracy and repeatability are achievable. Considering the achievable tolerances in manufacturing (length and width of the lines), a tolerance of +/-2% of the inductance value of the multistrip lines is possible. | | | | | |

FIG. 30

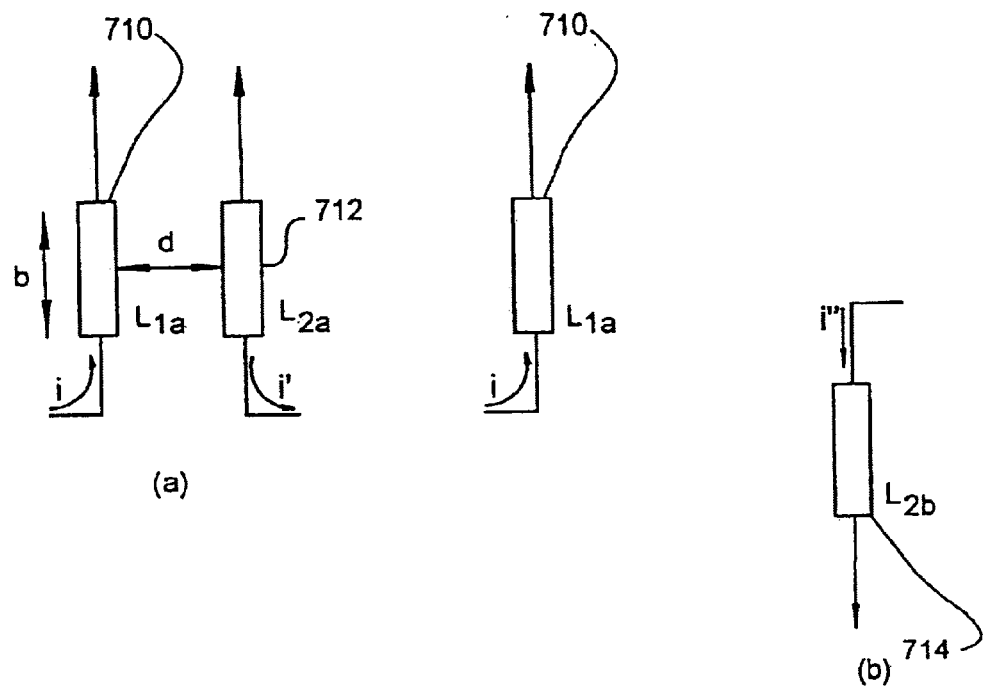
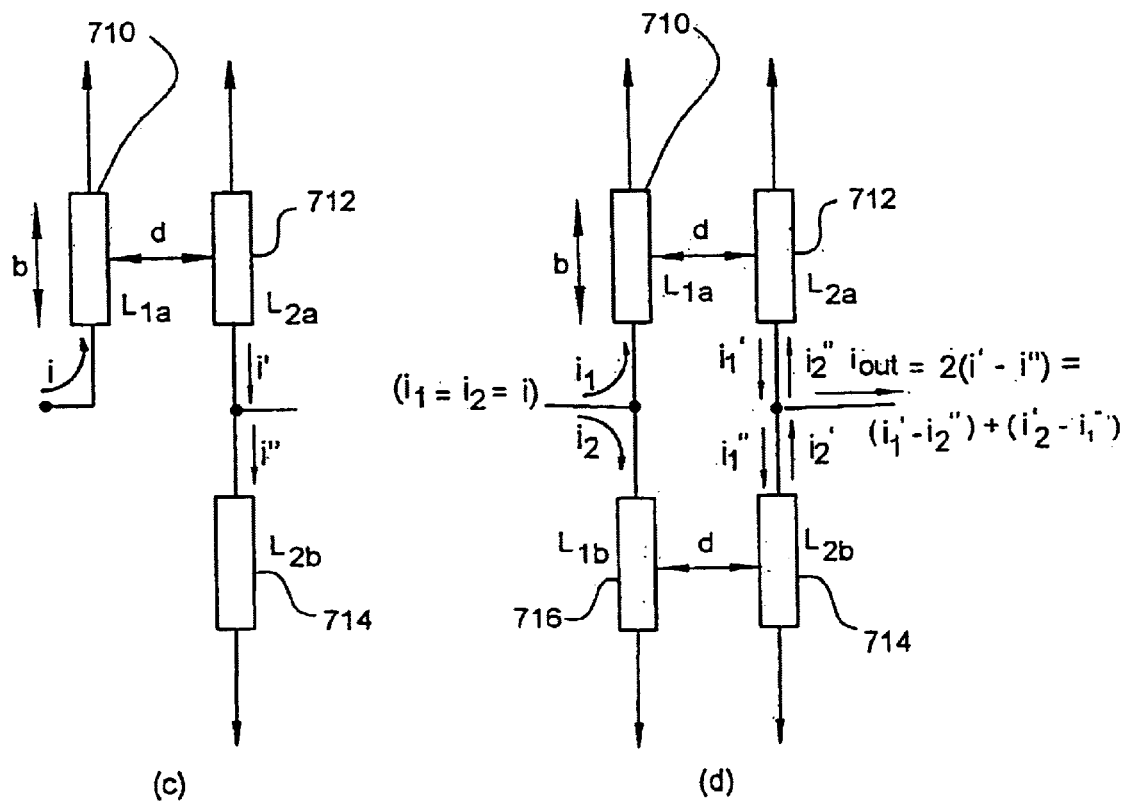
FIG. 33

NARROW BAND-PASS TUNED RESONATOR FILTER TOPOLOGIES HAVING HIGH SELECTIVITY, LOW INSERTION LOSS AND IMPROVED OUT-OF-BAND REJECTION OVER EXTENDED FREQUENCY RANGES

This application is a continuation-in-part of U.S. application Ser. No. 09/039,988, filed Mar. 16, 1998 now issued as U.S. Pat. No. 6,215,374.

BACKGROUND OF THE INVENTION

1. Field of the Invention

This invention relates to narrow band-pass tuned resonator filter topologies for advantageous application over high frequency (HF), very high frequency (VHF), ultra high frequency (UHF) and microwave bands, and more specifically to such topologies capable of maintaining over the frequency ranges of interest a high loaded Q for increased selectivity, optimal coupling to minimize insertion loss with improved out-of-band rejection, and which are relatively simple and inexpensive to manufacture with a high degree of repeatable accuracy.

2. Background of the Related Art

The processing of broadband multi-carrier signals presents a particularly rigorous and stringent context for signal processing circuitry such as filters. The base-band television signal for example, which has a bandwidth on the order of about 5–6 MHz, is typically mixed with (to modulate) an RF (radio frequency) carrier signal, thereby placing it on an RF channel in the range of 50 to 1000 MHz or greater, to achieve frequency division multiplexing (FDM). Other applications, such as in microwave communications, can require a range of operation of 1–2 GHz and beyond. Applications that require the processing of broadband signals containing a multiplicity of channels simultaneously, such as the transmission and reception of a television broadcast (either through air or via fiber optic/coaxial cable), can present situations requiring filters to pass only a small fraction of the total bandwidth (i.e. those frequencies that fall within the narrow pass band, typically one channel of interest) while rejecting the rest of the frequencies over the total bandwidth (i.e. those falling within the stop-band). This is typically accomplished using a narrow band-pass filter. Depending on the system design for a particular implementation, these filters may be required to operate on the same RF frequency as the RF channel of interest, or at some other frequency to which the RF channel may have been up or down converted (the intermediate frequency or IF), which is typical for wide frequency agile systems.

Noise and image signals, as well as various undesired spurious signals, can be injected or generated at various points in processing, and thus band-pass filters are often called upon to reject (i.e. attenuate) out-of-band signals to significantly low levels, depending upon the sensitivity of the application. For example, even signals attenuated up to 60 dB can still be seen in received video transmissions. Thus, it is often critically important that any signals present other than the base-band signal modulated on the desired carrier be sufficiently attenuated. This often requires band-pass filters to be very selective (i.e. ideally passing only that fraction of the total bandwidth that contains the base-band signal of interest), with little or no loss of energy in the pass-band (i.e. low insertion loss), but maintaining the requisite measure of attenuation for all other frequencies in the stop-band. Moreover, because the fraction of the total bandwidth occupied by base band signals in broadband applications are so small relatively speaking (on the order of 1–2%), such filters must produce the requisite frequency response with a high degree of accuracy and must maintain that response over time (i.e. the response should not drift). Further, they must be relatively immune to RF noise from external sources, as well as from coupling between their own components. Finally, it is always desirable that the filters be inexpensive, and easy to manufacture with a high degree of repeatable accuracy.

There are several known techniques for implementing band-pass filters. As previously discussed, the Q value of a filter indicates its selectivity; a filter's selectivity is defined by how quickly the filter's response transitions from the pass band to the stop band. The higher the Q of a filter, the steeper the roll-off from pass band frequencies to stop band frequencies. Because the input and output loading of a filter affects its Q, a more useful and practical measure is its "in-circuit" or loaded Q (i.e. $Q_L$). The $Q_L$ of a filter is roughly equal to the reciprocal of the fractional bandwidth of its frequency response, which is typically measured between the points on the response curve that are 3 dB below the peak of the response (i.e. the half-power points of the response). Thus, the $Q_L$ of a filter passing a 1-% fractional bandwidth is roughly 100. Narrow band-pass filters for broadband signal processing applications often require a high value of $Q_L$, while exhibiting low insertion loss (i.e. the amplitude of signals in the pass band should not be significantly attenuated), and attenuation off signals in the stop-band should meet the requirements of the applications.

One known technique for implementing band-pass filters involves the use of lumped LC components to produce classical filters based on the technique of low-pass to band-pass transformation. Several variations of topologies can be synthesized for producing desired band-pass filter responses. The shortcomings of such filters are numerous for purposes of processing broadband signals in the VHF and UHF frequency bands, the most serious of which is that the lumped components (particularly the coil inductors) are highly susceptible to parasitic effects at frequencies much above 100 MHz. Moreover, several stages of circuit components must be cascaded together to achieve the complexity of transfer function requisite for a high value of $Q_L$. Thus, such filters take up valuable space and make their cost of manufacture relatively high.

Another known technique for implementing filters employs helical resonators. Filters employing helical resonators are magnetically and/or capacitively coupled and are capable of producing a response with the high $Q_L$ and low insertion loss requisite for many broadband signal-processing applications. They are not, however, suitable for frequencies much below 150 MHz, because very large inductor values would be required for the resonators below that frequency. Such inductors are impractical or impossible to construct. Moreover, even at higher frequencies they are rather large mechanical structures (they require shielding both for proper operation and to reduce susceptibility to RF noise), which makes them relatively expensive to manufacture (even in high volumes). They also are highly susceptible to environmental shock and drift, and they typically require an adjustment in value during the manufacturing process to make sure that they resonate accurately at the proper frequency.

Yet another known technique for building band-pass filters employs magnetically and/or capacitively-coupled dielectric resonators, implemented either as cylindrical coaxial transmission lines, or as printed strip transmission lines sandwiched in between two ground plane shields.

These resonators are short-circuited transmission lines, and as such are exploited for their ability to resonate at a particular frequency as a function of their length relative to the wavelength of the transmitted input signal (the length of the line is typically $\lambda/4$ for the wavelength $\lambda$ of the resonant frequency). Such resonators are capable of producing high $Q_L$ values to achieve responses having the fractional bandwidth characteristic requisite for many broadband signal-processing applications (i.e. 1–2%). Because the trace length increases as the desired resonant frequency decreases, however, such resonators are not suitable for anything other than UHF (i.e. between about 400 MHz and several GHz). They become cost prohibitive for HF and VHF applications because the lengths of the transmission lines increase to a prohibitive size. Even at 1 to 2 GHz, these implementations require trace lengths on the order of about 2 to 1 inches respectively, which is still quite large and consumes significant area. Moreover, this would not scale well to manufacturing technologies of higher resolution (e.g. integrated circuits) because the length required to achieve one quarter of the wavelength is orders of magnitude too large for such technologies. Finally, such long quarter wavelength resonators are highly susceptible to transmitting and receiving noise.

Another well-known circuit topology for producing a band-pass filter response is that of the magnetically coupled, double-tuned resonant circuit. Band-pass filters so implemented are the least expensive to manufacture relative to the other various prior art techniques discussed herein (they can be manufactured for a few cents each). Implementations of such filters heretofore known have been unable to achieve the large $Q_L$ values necessary to produce responses having small fractional bandwidths and low insertion loss requisite of many applications such as broadband signal processing (they have typically achieved no better than about 15% fractional bandwidth or greater). The reasons for their shortcomings in such applications will be apparent to those of skill in the art in view of the following discussion.

The generic topology of a series double-tuned circuit 10 is illustrated in FIG. 1a, and that of a parallel double-tuned circuit 100 is illustrated in FIG. 2b. The series double-tuned circuit has an input resonator circuit 12 that is magnetically coupled to an output resonator circuit 14. Likewise, the parallel double-tuned circuit 100 has an input resonator circuit 120 magnetically coupled to an output resonator circuit 140. The input resonators 12, 120 are coupled to an input source modeled by sources $V_S$ 18, 180 and associated source impedances $R_S$ 16 and 160 respectively. The output resonators 14, 140 are coupled to the output load impedance modeled by resistors $R_L$ 15, 150 respectively.

The input and output resonators 12, 14 of the series tuned circuit 10 are formed as a series connection between lumped series capacitors $C_{S1}$ 11 and $C_{S2}$ 13 respectively, and inductors $L_1$ 17 and $L_2$ 19 respectively. The two series tuned resonators 12, 14 and the two parallel tuned resonators 120, 140 are magnetically coupled as a function of the physical proximity between their inductors, whereby a mutual inductance M 21 is created between them. $M = k\sqrt{L_1 \cdot L_2}$, where k is the coupling coefficient which has a value that is a function of the geometry of the inductive elements and their physical proximity to one another. Coupling coefficient k therefore reflects the percentage of the total potential mutual coupling between the two resonators. The closer in proximity the two inductors 17, 19 or 170, 190 are, the greater the value of k and therefore the greater the mutual inductance between the resonators; likewise, the further they are apart, the lower the degree of mutual inductance as reflected by the lower the value of k.

The parallel double-tuned circuit 100 is the theoretical dual of the series double-tuned circuit 10, and thus operates quite similarly. The resonators 120, 140 of the parallel tuned circuit 100 are formed as a parallel connection between lumped capacitors $C_{P1}$ 110 and $C_{P2}$ 130, and inductors $L_1$ 170 and $L_2$ 190 respectively. The parallel tuned resonators 120, 140 are also magnetically coupled as a function of the physical proximity between their inductors, whereby a mutual inductance M 210 is created between them. The mutual inductance of the parallel tuned circuit is given by the same equation, $M = k\sqrt{L_1 \cdot L_2}$, with its value of k dictated by the same geometrical considerations as previously discussed.

FIG. 2 illustrates three typical responses of a double-tuned resonant circuit (either series or parallel), for different values of the coupling coefficient k. Response 22 is obtained when the two resonators of the circuit are critically coupled at the resonant frequency, which is the point at which the circuit exhibits an optimal combination of minimal insertion loss and average selectivity at the resonant frequency. Response 24 illustrates the response of the double-tuned circuits 10 and 100, when their respective input and output resonators are under-coupled. This occurs for values of k approaching zero, which can be accomplished by moving the resonators of the circuit further apart. When undercoupled, the value of the circuits' $Q_L$ increases (the fractional bandwidth decreases) but the insertion loss also increases, which is not desirable. Response 26 occurs when the two inductors of the input and output resonators are so close together they become over-coupled (i.e. k approaches a value of 1). Response 26 is characterized by two maxima on either side of the resonant frequency, but the circuits exhibit their lowest $Q_L$ value (and thus their largest fractional bandwidth). From these responses, it can be seen that there is a trade-off for double-tuned filter implementations, between the maximum attainable $Q_L$ value and insertion loss. For a given frequency, this tradeoff is effected as a function of the mutual inductance M between the resonators of such filter implementations. Optimal coupling clearly occurs at or near the critical range, because it provides the best compromise between stop-band performance and insertion loss.

It is important to note that as frequency increases, the overall inductive coupling between the resonators increases. This is because the overall inductive coupling between the resonators is not only a function of the mutual inductance M (which is a function of the geometric properties and the proximity of the resonators), but is also a function of the inductive reactance, which is a direct function of frequency (i.e. $w \cdot M$). Thus, as frequency increases for a given value of M, the inductive coupling between the resonators increases and the circuit eventually becomes over-coupled. To a certain point, one can compensate for this increase in coupling by simply increasing the spacing between the inductors, thereby lowering M by decreasing k. However, increasing the spacing at frequencies in the 1 GHz range and above becomes impracticable.

The $Q_L$ for a series tuned circuit is roughly determined as the reactance X of the tuned circuit network at the resonant frequency ($w_o \cdot L$), divided by the load or source impedance coupled to it. Thus, $Q_L$ for the output resonator 14 is $$\cong \frac{w_0 \cdot L_2}{R_L}.$$

For a given resonant frequency $w_o$, one could increase the $Q_L$ by increasing the value of $L_2$. (Of course, to increase the overall $Q_L$ for the series double-tuned resonator, one would do the same for the input resonator 12 by increasing the value of $L_1$ as well). The problem with this approach is that there are practical limitations on the size of the inductors $L_1$, $L_2$ that can be manufactured and implemented at a reasonable cost. Moreover, as the values of $L_1$, $L_2$ are increased, the parasitic shunt capacitance associated with a lumped value inductor (typically a coil) degrades the frequency response of the filter at frequencies above 200 MHz. Finally, because the resonant frequency is determined by the equation $$w_0 = \frac{1}{\sqrt{L_2 \cdot C_{S2}}}$$

(for the output resonator 14), the value of $C_{S2}$ must be reduced commensurately to maintain the value of $w_o$. There are also practical limitations on how small $C_{S2}$ can be built accurately.

FIG. 3 illustrates the series double-tuned circuit 10 of FIG. 1 with values for k, $C_{S1}$ 11 and $C_{s2}$ 13, and $L_1$ 17 and $L_2$ 19, designed to push the value of $Q_L$, while maintaining optimal coupling for the circuit at a resonant frequency of 400 MHz. FIGS. 4a and 4b show the simulated response for the circuit 30 having the indicated component values as shown in FIG. 3. The pairs of values across the bottom of FIGS. 4a and 4b indicate the frequency (in MHz) and attenuation (in dB) values for the points 1–4 as indicated on the response curve. The response as shown in the scale provided in FIG. 4a illustrates the unacceptable performance of the filter at high frequencies for television signal processing applications. The smaller scale provided by FIG. 4b shows the 3 dB fractional bandwidth to be about 16% (and thus the approximate value of $Q_L$ is 6.25). As previously discussed, this is unacceptable for many broadband signal processing applications.

The $Q_L$ for a parallel tuned circuit is roughly determined as the admittance of the network at the resonant frequency, multiplied by the load or source impedance coupled to it. Thus, $Q_L$ for the parallel tuned output resonator 140 is $\equiv w_o \cdot C_{P2} \cdot R_L$. Thus, it can be seen that to increase $Q_L$ for the parallel tuned output resonator, one could increase the value of $C_{P2}$ and $R_L \cdot R_L$ can't be increased much above 100 ohms, as the signal would tend to be shunted to ground through parasitic shunt elements. Increasing $C_{P2}$ requires that $L_2$ be made very small. To manufacture lumped inductors on the order of 5 nH using known techniques with acceptable accuracy is very difficult, as such inductors are very sensitive to geometric variation, especially longitudinally. Furthermore, obtaining and maintaining proper coupling between such small coils on a repeatable basis is nearly impossible. The small coils require a small gap between them to maintain optimal coupling (typically at or near critical coupling), and the coupling coefficient is highly sensitive to dimensional variations in this small gap. Such component and dimensional variations cannot be tolerated when fractional bandwidths on the order of 1% are required.

FIG. 5 illustrates the parallel double-tuned circuit 100 of FIG. 1 with values for k, $C_{P1}$ 110 and $C_{P2}$ 130, and $L_1$ 170/$L_2$ 190, with an L to C ratio designed to push $Q_L$ for the circuit with optimal coupling at a resonant frequency of 400 MHz. FIGS. 6a and 6b show the simulated response for the circuit 50 having the indicated component values as shown in FIG. 3. The pairs of values across the bottom of FIGS. 6a and 6b indicate the frequency (in MHz) and attenuation (in dB) values for the points 1–4 as indicated on the response curve. The response as shown in the scale provided in FIG. 6a illustrates the unacceptable performance of the filter in the stop-band, even though it operates more symmetrically at high frequencies relative to the series tuned circuit 30 of FIG. 3. Even though the coil values used in this example of the prior art are being pushed to the limit, the bandwidth of this filter is still not narrow enough for many applications. The smaller scale provided by FIG. 6b shows the 3 dB fractional bandwidth to be about 15.5% (and thus the approximate value of $Q_L$ is 6.45. As previously discussed, this is unacceptable for many broadband signal processing applications that require fractional bandwidths of 1 to 2% (i.e. $Q_L$ values in the 50 to 100 range).

Thus, those of skill in the art will recognize the need for band-pass filter circuits that provide characteristics required for many broadband signal processing applications over bandwidths spanning about 50 to 2000 MHz or greater. Those characteristics are namely high Qua values to provide high selectivity and therefore small fractional bandwidths, high attenuation in the stop-band, low insertion loss in the pass-band, and which can be manufactured as cheaply and repeatably as the tuned resonator circuits of the prior art.

SUMMARY OF THE INVENTION

It is therefore an objective of a first embodiment of the present invention to provide a band-pass filter employing a parallel. double-tuned magnetically coupled resonator topology that can achieve substantially higher values of $Q_L$ than previously attainable using such a topology.

It is another objective of the first preferred embodiment to achieve the higher values of $Q_L$ with a topology that can be manufactured inexpensively and with a high degree of repeatable accuracy.

It is a further objective of the first preferred embodiment to be relatively immune to RF noise in its environment.

It is an objective of a second embodiment of the present invention to achieve still higher values of $Q_L$, with low insertion loss and a steeper roll-off between the pass-band and the stop-band at both lower and higher frequencies, with the addition of only one additional component to the first embodiment.

It is an objective of a third embodiment of the present invention to achieve still higher values of $Q_L$, with low insertion loss and a steeper roll-off between the pass-band and the stop-band (at both lower and higher frequencies), with the addition of only one additional component to a known series double-tuned magnetically coupled resonator topology.

It is an objective of a fourth embodiment of the invention to achieve desirable values for $Q_L$, absolute bandwidth and insertion loss at even higher ranges of the UHF frequency band, namely between about 500 MHz and above 2 GHz using a novel and nonobvious circuit topology that is easy and cost effective to manufacture.

These and other objectives will be clear to those of skill in the art in view of the detailed description of the invention.

A first preferred embodiment of the band-pass filter of the present invention employs a parallel double-tuned resonator topology that achieves higher values of $Q_L$ by using an electrically short (on the order of 1% of the wavelength of the resonant frequency) transmission line as a very small inductance component by which the resonators are magnetically coupled. The transmission line is manufactured as a metal trace having precisely controlled geometric dimensions by which the requisite inductance value is realized. The dielectric constant of the printed circuit board material is 4.65 with a thickness of 1.5 mm. The traces are made with copper having a thickness of 0.018 mm. The microstrip inductors are then physically positioned to obtain a coefficient of coupling (k) on the order of 0.01 to 0.02, depending upon the value required to maintain optimal coupling for a given frequency. One end of the transmission line traces is coupled to the series capacitor, and the other is terminated to ground. Inductor values can be accurately produced down to about 0.5 nH with an accuracy of about ±2%.

In a second preferred embodiment of the band-pass filter of the present invention, a parallel double-tuned resonator of the first preferred embodiment is modified by the addition of a coupling capacitor, within each of the magnetically coupled resonators, the capacitor being coupled in series with, and having a much smaller value than, the shunt capacitance that is in parallel with the magnetically coupled microstrip transmission line inductors.

In a third preferred embodiment of the invention, a prior art series double-tuned resonator topology is modified by the addition of a shunt capacitance within each of the resonators, the shunt capacitance coupled in parallel with the series components of the two resonators, and having a value that is much larger than the value of the capacitance in series with the inductance. The inductance is realized preferably using an air coil or other known lumped inductance element.

The second and third embodiments are both capable of being used as an electronic tuner, simply by substituting a veractor or other known controllable capacitance for either the series or shunt capacitors of the resonators.

A fourth embodiment of the invention is disclosed the topology of which compensates for the increased inductive coupling and decreased Q that besets the first three embodiments as the tuned frequency exceeds about 1 GHZ. The topology comprises the mirror image of each of the resonators of the tuned parallel resonator topology previously disclosed, each mirrored about their respective signal lines. The mirrored images of each of the resonators serves to substantially cancel out the mutual inductance between the two resonators and therefore offsets what would otherwise be significant increase in inductive coupling with increased frequency, Further, the parallel nature of the mirrored inductors reduces the value of the effective inductance for each resonator by more than 50 percent, such that the value of $C_P$ for each resonator can be increased to offset the decrease in the loaded Q of the circuit with the increase in frequency.

The inductor elements for each resonator and its mirror image can be implemented as a single strip of metal, or preferably they are implemented as several strips in parallel to further reduce the effective inductance for each resonator and without a commensurate increase in the inductive coupling. Implementing the inductor elements as parallel strips produces the added freedom to adjust the value of the effective inductance for each the inductance values by adding metal to short the strips, thereby permitting the filter to be tuned under test. Of course, one could reduce the inductance by adding to the width of the strip, but the inductive coupling would then increase commensurately with reduction in the value of L. to tune the filter circuit by adjusting the without increasing the inductive coupling much. Moreover, producing the inductance for each resonator and their mirrors as a parallel structure permits shorts to be created by adding metal between the strips to tune the filter during test. Of course, one could employ laser trimming to accomplish the same goal.

Any of the preferred embodiments can be arranged in a differential configuration to cancel any common mode noise that might be induced in the inductors from the environment by arranging the inductors such that their network currents flow in opposite directions. The preferred embodiments can also be arranged in balanced-to-balanced and balanced-to-unbalanced configurations. Any of the preferred embodiments can have its resonators physically arranged relative to each other in no particular position. Special cases such as parallel (with 0 degrees or 180 degrees orientation) or perpendicular relative positions of the resonators are of primary interest, although other orientations (such as 45 degrees or similar) can offer additional topological flexibility, as well as provide an additional degree of freedom to control the coupling coefficient k. The component values of the resonators of any of the preferred embodiments can be arranged in either a symmetrical or asymmetrical arrangement, either for impedance transformation or to adjust the frequency response of the filters. Finally, multiple resonators in any of the preferred embodiments can be cascaded together to increase the complexity of the transfer function, thereby increasing the $Q_L$ and the slope or roll-off from the pass band to the stop-band.

BRIEF DESCRIPTION OF THE DRAWINGS

FIG. 3 is an example of the series resonator of FIG. 1a with extreme component values for known implementations of the resonator to achieve a maximum $Q_L$.

FIG. 4a is a simulated response for the prior art resonator of FIG. 3 using a broad scale for both frequency (40 MHz/div.) and attenuation (10 dB/div.).

FIG. 30 is a table that provides equivalent bulk inductance values for the resonators of each of the embodiments depicted in FIGS. 8b, 11, 13, 15, 17, 19 and 21.

FIG. 32a is an embodiment of the mirror image topology of the present invention as applied to the parallel tuned resonator of FIG. 10a.

FIGS. 33a–d illustrate the stepwise determination of the induced currents for the mirror image topology of the present invention.

DETAILED DESCRIPTION OF THE INVENTION

Figure 1A:
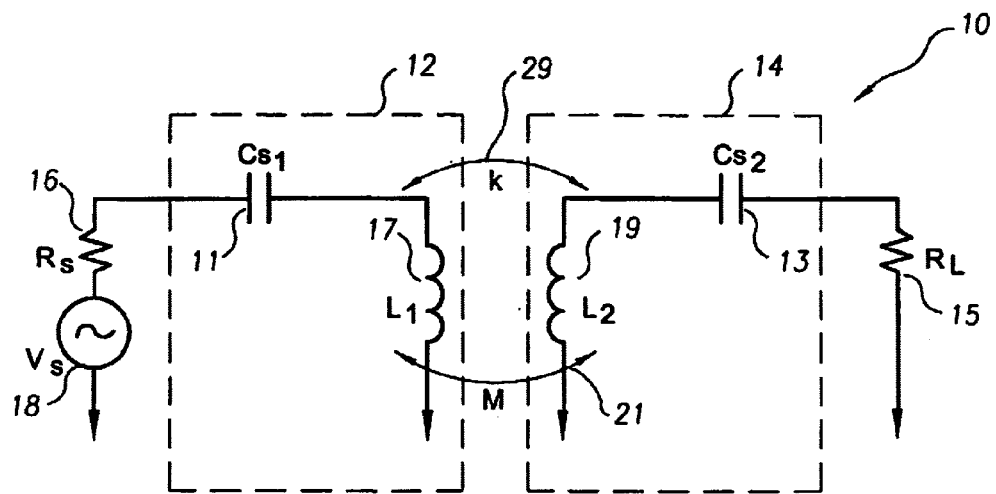
FIG. 1a is an illustration of a series double-tuned magnetically coupled resonator topology of the prior art.
Figure 1B:
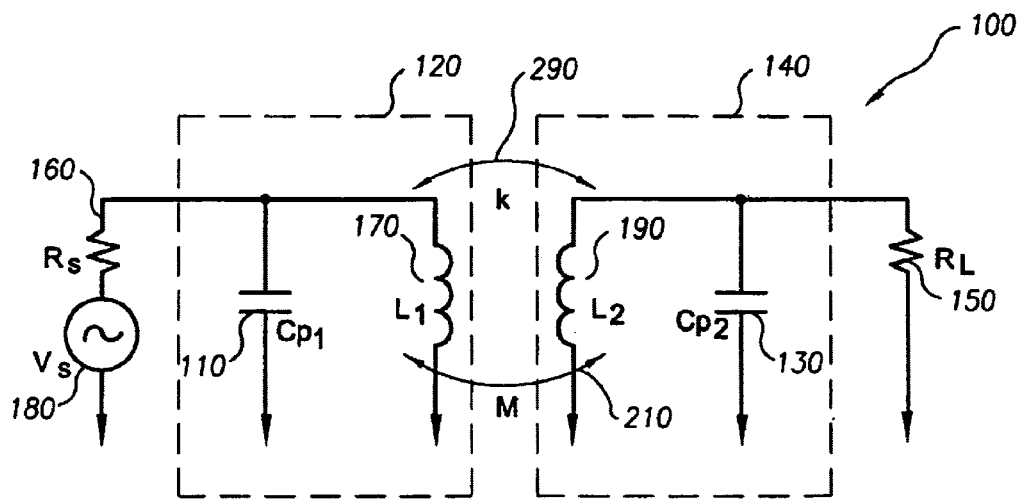
FIG. 1b is an illustration of a parallel double-tuned magnetically coupled resonator topology of the prior art.
Figure 2:
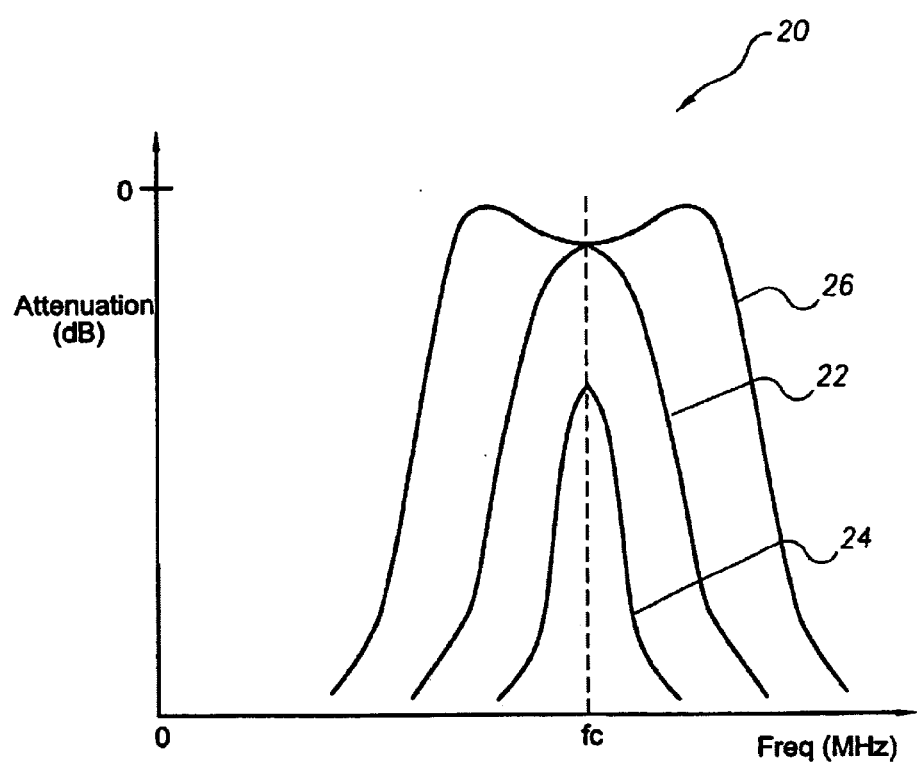
FIG. 2 is an illustration of three typical responses for the resonators of FIGS. 1a and 1b as the value of the coupling coefficient k is changed.
Figure 4B:
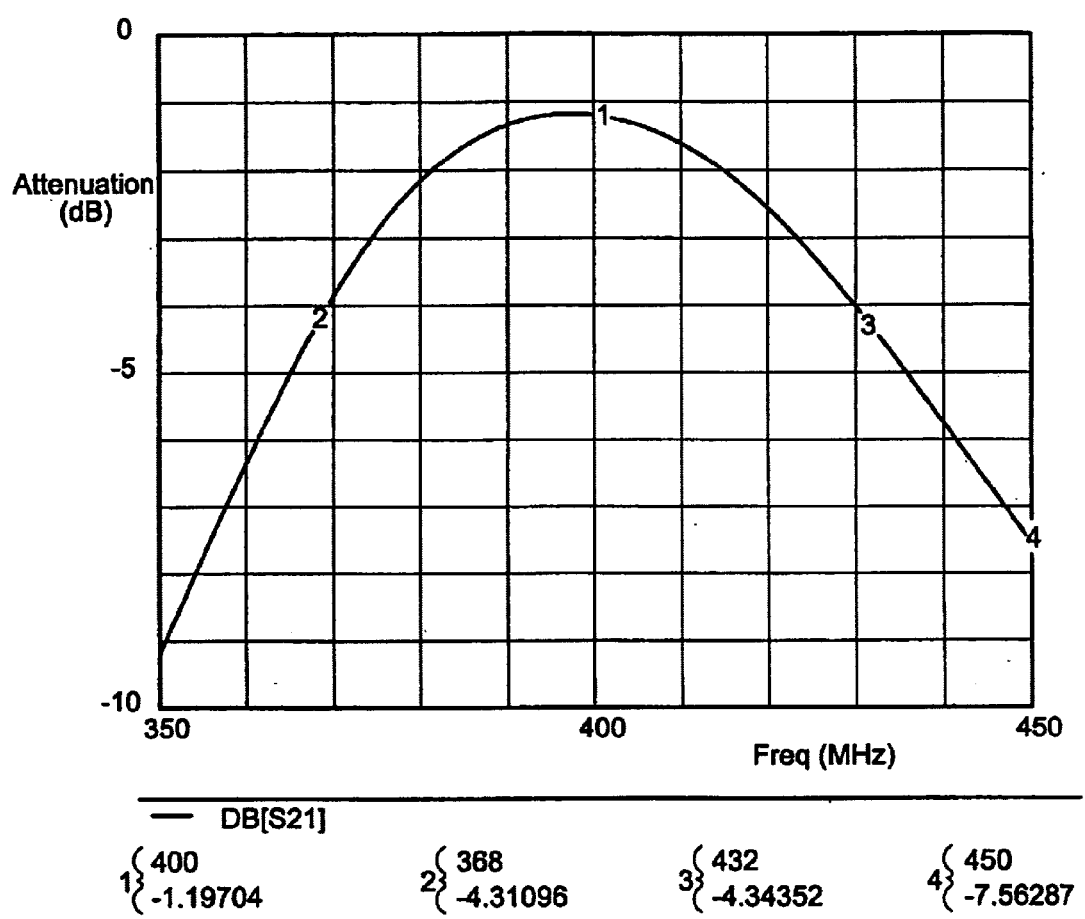
FIG. 4b is the simulated response for the prior art resonator of FIG. 3 using a smaller scale for both frequency (10 MHz/div.) and attenuation (1 dB/div.).
Figure 5:
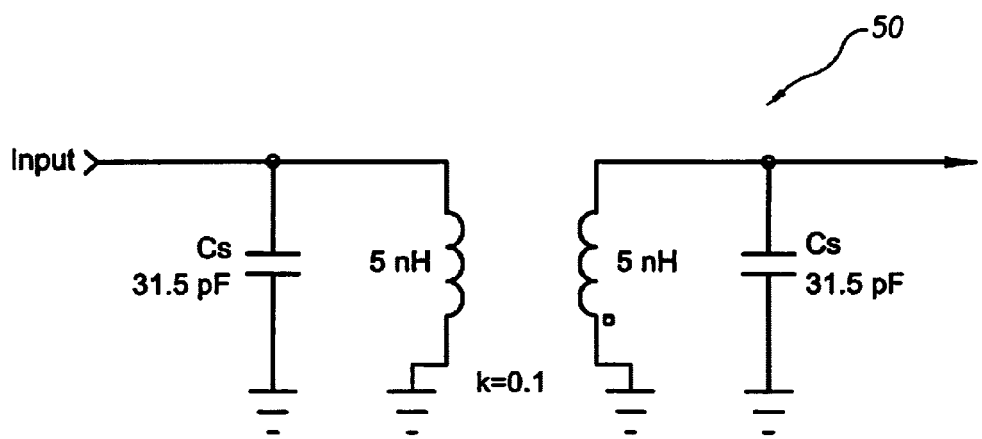
FIG. 5 is an example of the parallel resonator of FIG. 1b with extreme component values for prior art implementations of the resonator to achieve a maximum $Q_L$.

The following is a detailed description of the preferred embodiments of the present invention. As previously discussed, the double-tuned resonators of FIGS. 3 and 5 fell short of achieving the values of $Q_L$ required for many broadband applications, even when their LC ratios were increased to increase their $Q_L$. With respect to the parallel double-tuned resonator topology of FIGS. 1b and 5, the limitation was that the values of L could not be decreased beyond approximately 5 nH.

Figure 7:
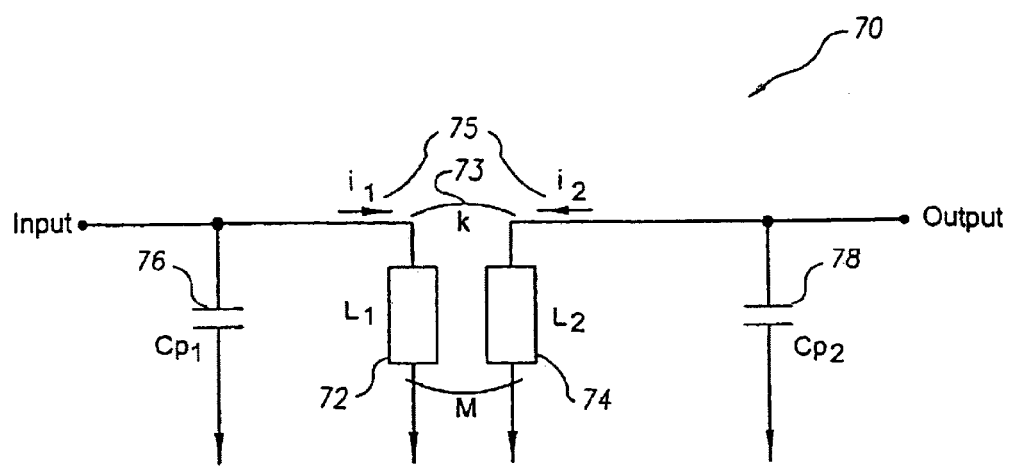
FIG. 7 is an example of the parallel resonator of the first preferred embodiment of the present invention using a small grounded microstrip transmission line to achieve a very small but accurate effective inductance.

In a first preferred embodiment of the invention shown in FIG. 7, a metal trace formed of copper on a printed circuit board is used as inductors $L_1$ 72 and $L_2$ 74 for the parallel double-tuned resonator 70. The metal traces are coupled at one end to the shunt capacitors $C_{P1}$ 76 and $C_{P2}$ 78 respectively; their other ends are terminated to ground. By this technique, effective inductance values down to 0.5 nH are attainable with an accuracy of ±2%. Thus, it can be appreciated that the $Q_L$ of a parallel double-tuned resonator can be further increased beyond values attainable by the prior art simply because the inductance values may be decreased accurately below 5 nH, which permits the values of $C_{P1}$ 76 and $C_{P2}$ 78 to be increased.

An additional benefit to this novel and unobvious use of microstrip transmission lines as lumped inductor elements is that the currents $i_1$ and $i_2$ (75) flowing at and close to the resonance frequency are very large because the impedance of the very small inductors is so low. The increased currents will boost the energy available for transfer between the resonators. Thus, the total inductive coupling for the circuit will be greater for a given M, permitting the filter to be optimally coupled even though under-coupled. The $Q_L$ can therefore be higher courtesy of the under-coupling, but the insertion loss will be reduced because of the higher currents. Moreover, because the small inductance values result from small physical size, and a very low physical profile with respect to the PCB, their susceptibility to RF noise (and, by reciprocity, radiation) is significantly lower relative to the lumped inductor components of the prior art. They are easy and very low in cost to manufacture, with a high degree of accuracy and repeatability. Finally, this topology and its implementation are fully scaleable in accordance with the resolution of the manufacturing process employed. Thus, while the resolution of the process of manufacturing printed circuit boards may limit the minimum length of inductor strips to about 5 mm, manufacturing these topologies on silicon at the resolutions permissible will lead to commensurately smaller inductors and thus commensurately smaller values of effective inductance.

Figure 8A:
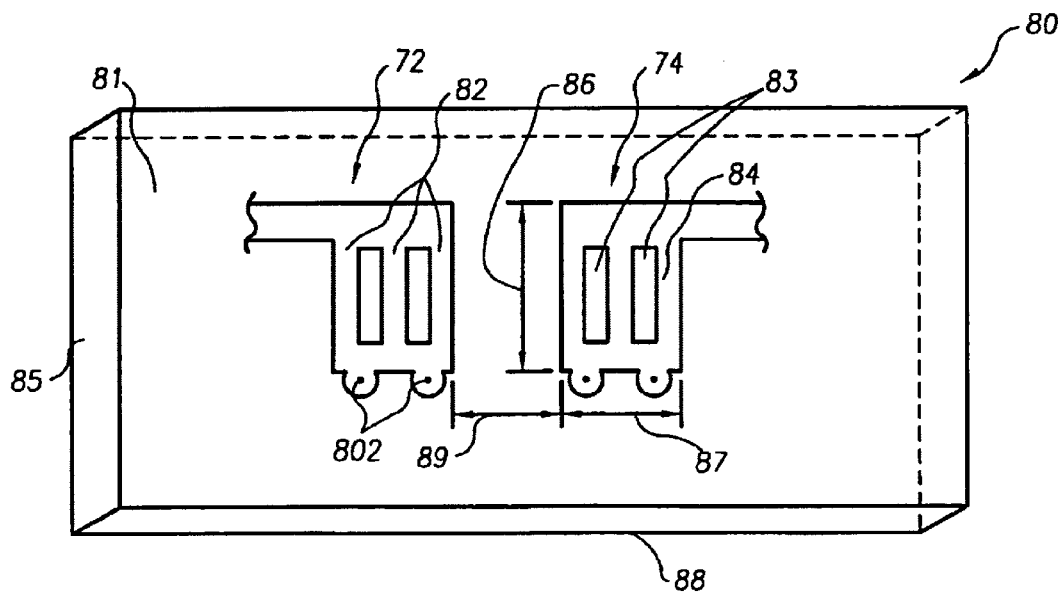
FIG. 8a is a plan view of a physical representation of the micro-strip effective inductance elements of the present invention.

FIG. 8a illustrates a plan view of a portion of a PCB upon which inductor elements $L_1$ 72 and $L_2$ 74 (FIG. 7) are built. In the preferred embodiment, the inductor elements are formed on the top surface 81 of the PCB 80 as copper micro-strip traces 82 and 84 respectively. The micro-strips are manufactured using well-known metal deposition and etching techniques. The geometric dimensions of the micro-strips (i.e. height 86, width 87) the spacing 89 between them determine the effective inductance of the elements as well as the degree of mutual inductance M 73 given as a function of coupling coefficient k. The thickness of the traces is preferably 0.018 mm. The thickness or height 85 of the PCB is preferably 1.5 mm, and is constructed of a material having a dielectric constant of 4.65. The terminated ends of the micro-strips are grounded to the ground-plane 88 of the PCB 80 via through-holes 802. The through-holes 802 have their own self-inductance (on the order of 0.1 nH, depending on the hole diameter) which must be accounted for in the implementation. If necessary, providing multiple ground holes will lower the total inductance of the holes. The ground-plane 88 is typically formed on the backside of the PCB, but could be located on top of or inside the PCB 80.

In the preferred embodiment, the micro-strips can be broken up into parallel micro-strips by etching away portions 83 of the metal inside the micro-strip as shown. This provides an additional degree of freedom in controlling the effective value of the inductance relative to the coupling coefficient k. For example, by employing three micro-strip lines in parallel (as shown in FIG. 8a), each having a width of 2 mm and a length of 5.5 mm, an effective inductance of about 0.72 nH can be realized as a parallel combination of inductive elements each having a larger value of inductance. The effective inductance realized by such a parallel combination is approximately equal to 1/n·L, where n is the number of micro-strips in parallel each having an inductance value of L. The benefit to using micro-strips in parallel rather than a single strip having a width equal to the sum of the widths of the n parallel strips that the increase in coupling commensurate with the increase in the width of the strip is significantly less for the parallel strips. There are some practical limitations, however, to the number of micro-strips that can be employed in a parallel combination. One is the diminishing returns for each additional strip added, and another is the fact that as the total width of the inductor strips increases, the impedance can begin to behave in a distributed manner rather than in a lumped manner. A circuit representation of a filter implementation that employs the three line inductance elements of FIG. 8a is illustrated with component values in FIG. 8b.

Figure 6A:
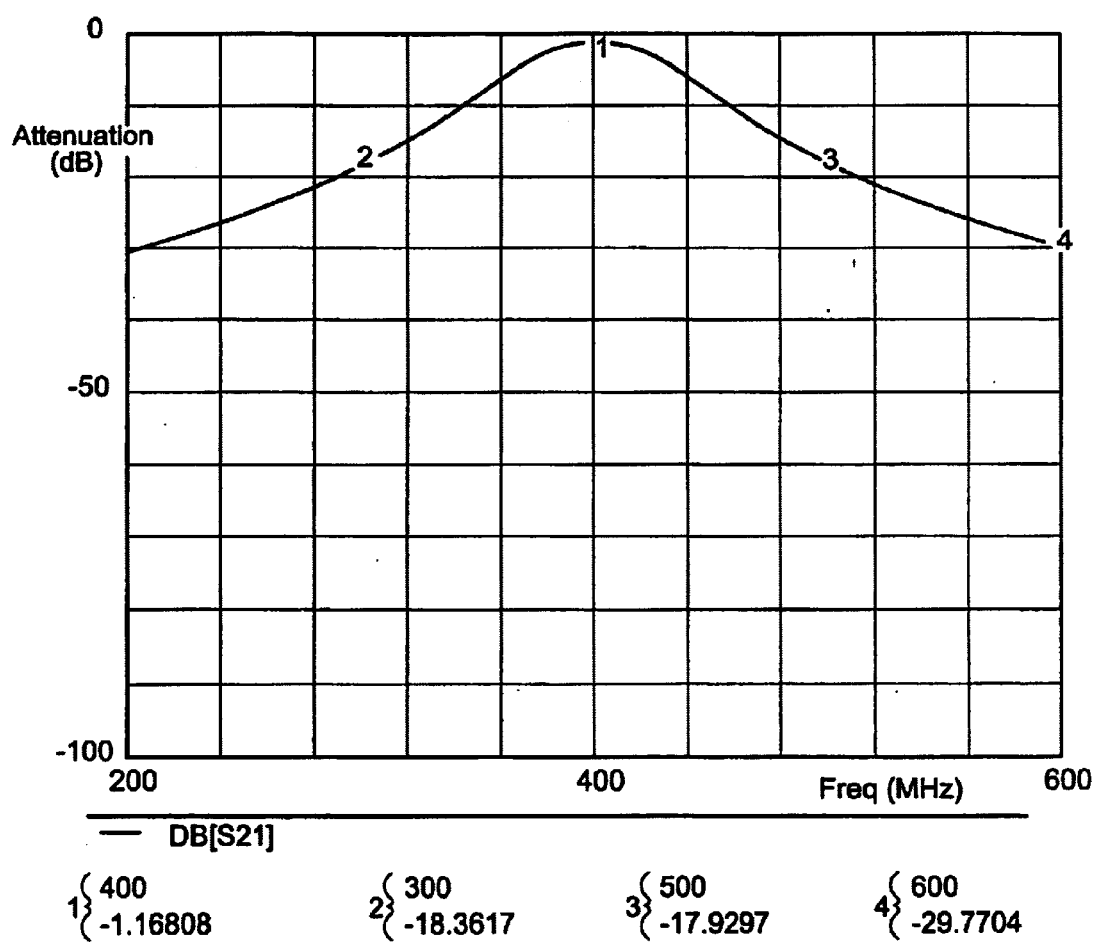
FIG. 6a is a simulated response for the prior art resonator of FIG. 5 using a broad scale for both frequency (40 MHz/div.) and attenuation (10 dB/div.).
Figure 6B:
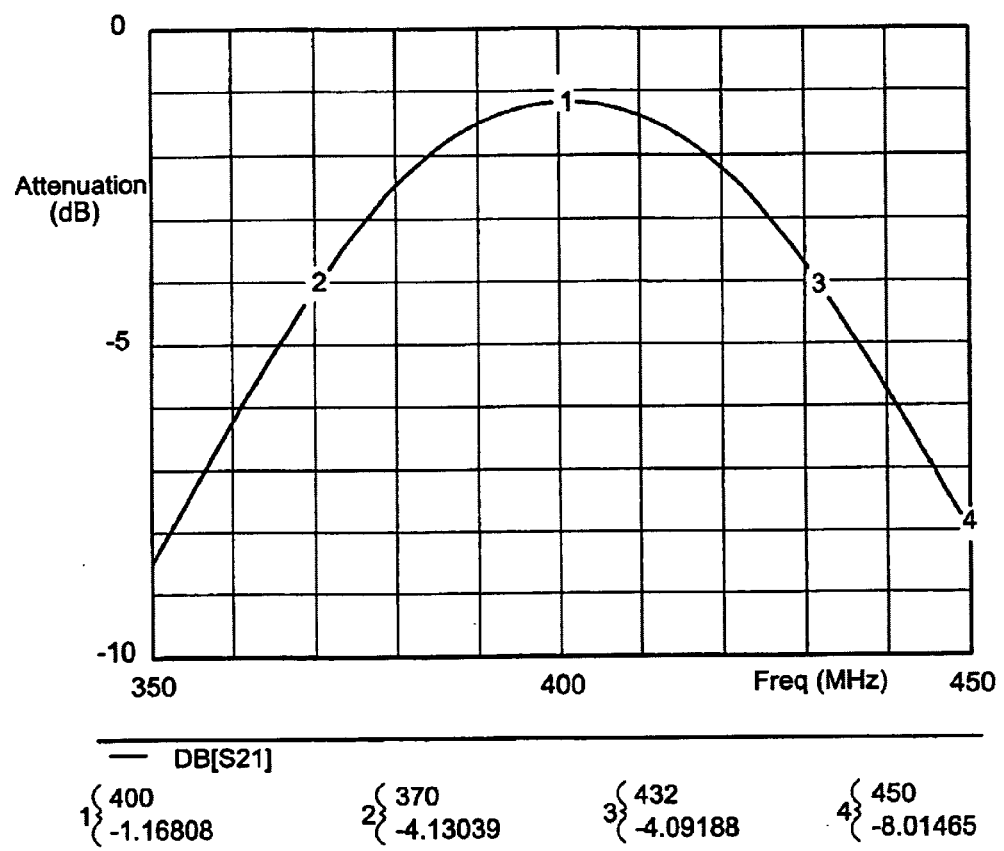
FIG. 6b is the simulated response for the prior art resonator of FIG. 5 using a smaller scale for both frequency (10 MHz/div.) and attenuation (1 dB/div.).
Figure 9A:
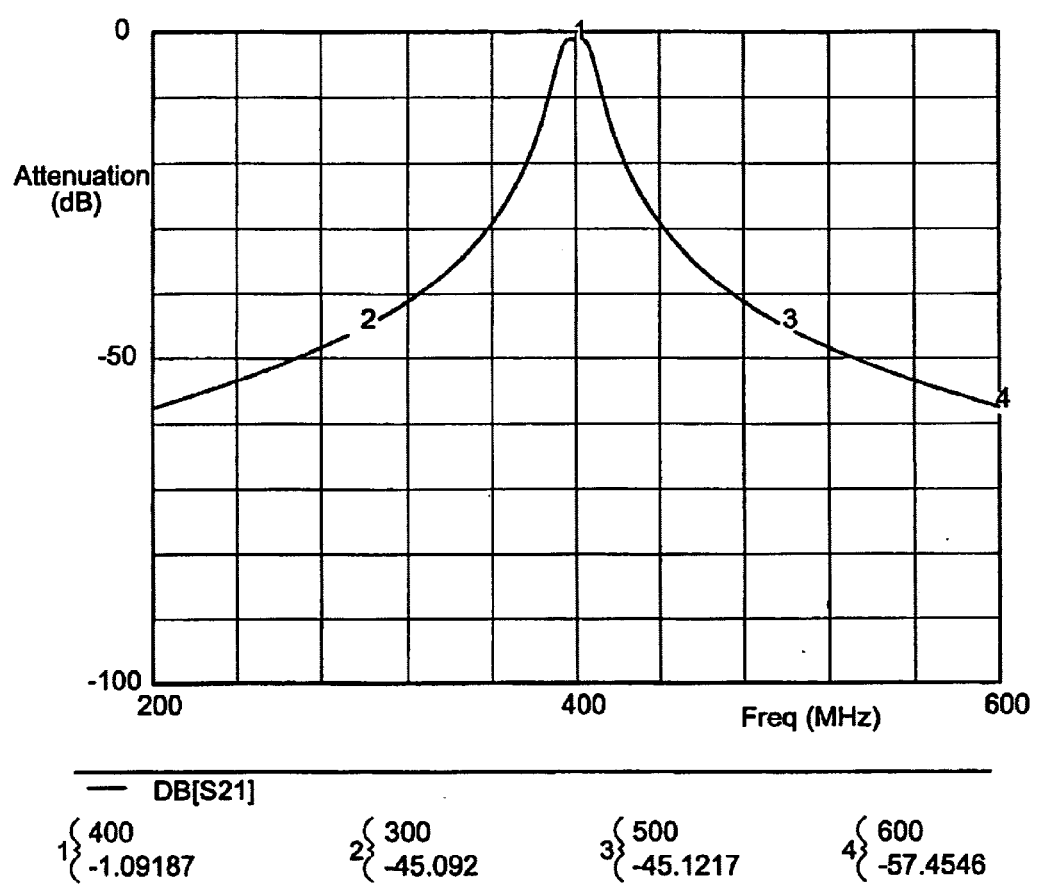
FIG. 9a is a simulated response for the resonator of FIG. 8b using a broad scale for both frequency (40 MHz/div.) and attenuation (10 dB/div.).
Figure 9B:
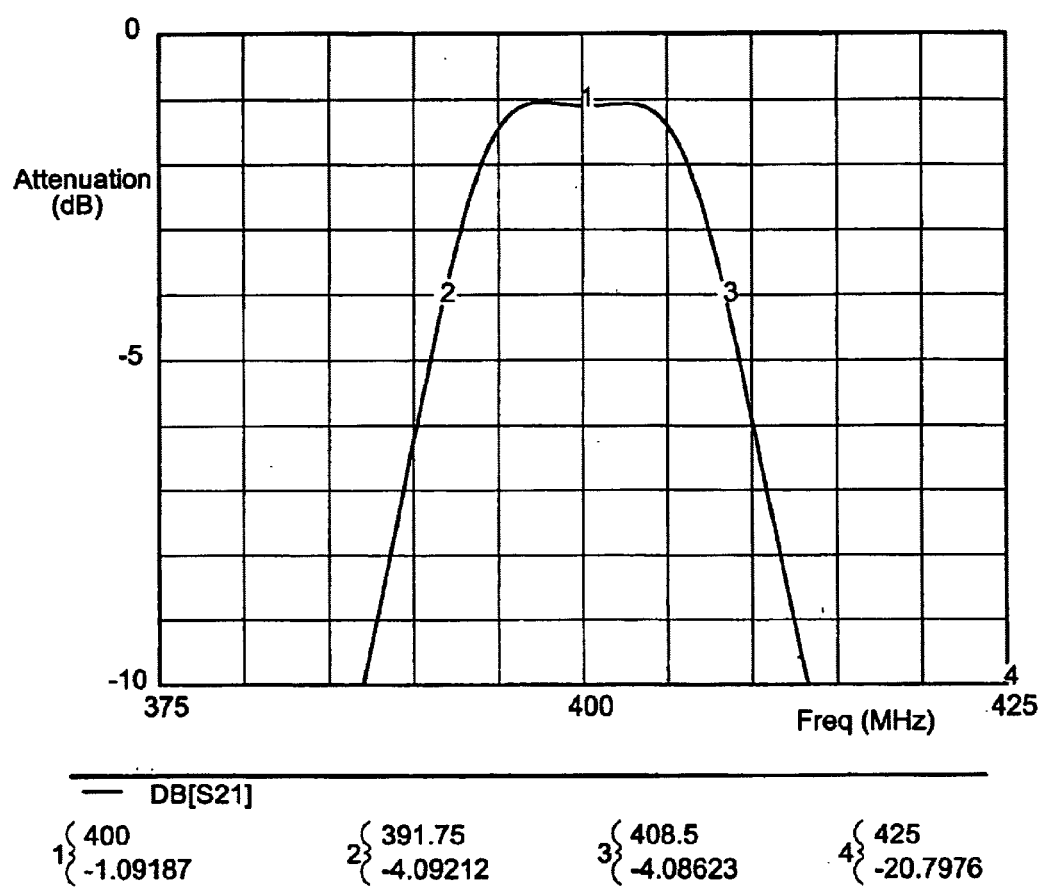
FIG. 9b is the simulated response for the resonator of FIG. 8b using a smaller scale for both frequency (10 MHz/div.) and attenuation (1 dB/div.).

The improved response for the double-tuned resonator topology using microstrip inductance elements over the prior art implementation of the topology using prior art lumped inductor components (FIG. 5) is illustrated by comparison of the simulated output responses of FIGS. 9a and 9b (for the present invention) with the responses of FIGS. 6a and 6b (for the prior art). The first embodiment of the present invention achieves a $Q_L$ of about 25 (and thus a fractional bandwidth of about 4%) at a resonant frequency of 400 MHz, compared to a $Q_L$ of about 6.5 (and a fractional bandwidth of about 15.5%) for the prior art at the same frequency. The out-of-band attenuation is also significantly improved.

Those of skill in the art will recognize the novelty and nonobvious use of microstrip transmission lines as effective inductor elements in magnetically coupled resonators, which is significantly distinctive over the prior use of microstrip transmission lines as resonators. The use of microstrip transmission lines as resonators relies on the inherent resonance of transmission lines when their length is the appropriate fraction (typically one-quarter of the wavelength) of the center or resonant frequency. The present invention employs micro-strips where the length is only on the order of 0.5% to 10% of the wavelength of the resonant frequencies of interest. They are able to act effectively as lumped inductive components rather than as distributed impedances in the manner of transmission line resonators. As previously discussed, to use transmission lines as resonators for the broadband applications of interest would require transmission lines of prohibitively long lengths at lower frequencies.

Figure 10A:
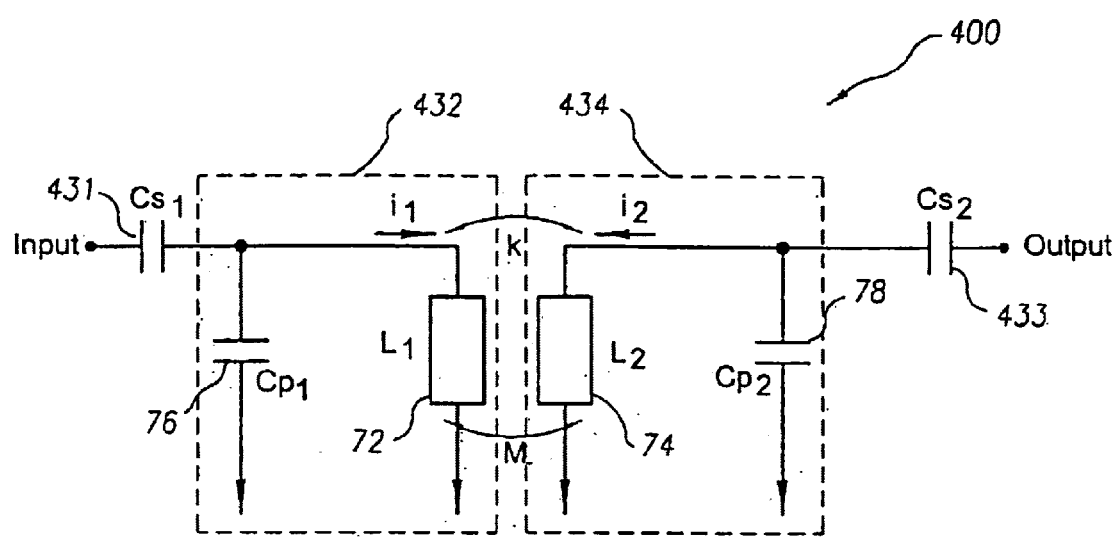
FIG. 10a is an illustration of a parallel tuned resonator circuit using microstrip transmission lines as bulk inductance elements and having an additional capacitive element in series between the resonators and the input and output signals.
Figure 10B:
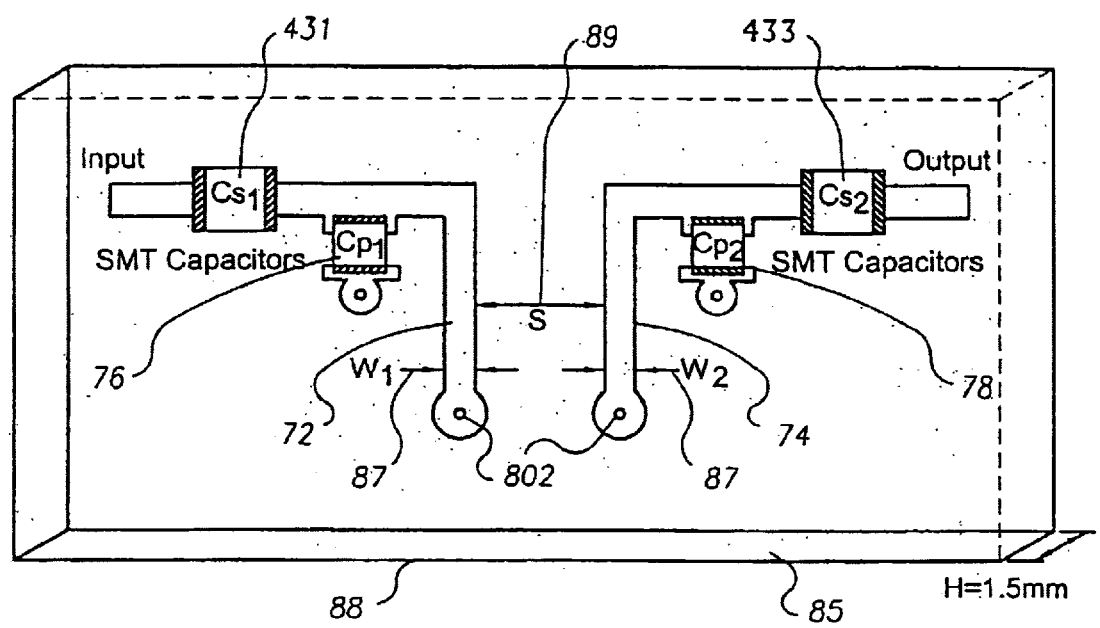
FIG. 10b is an illustration of a physical embodiment the parallel tuned resonator of FIG. 10a using printed circuit board manufacturing techniques.

FIG. 10a illustrates a second preferred embodiment of the invention, wherein an additional capacitor ($C_{s1}$ 431 and $C_{s2}$ 433 respectively) is added in series with the parallel tuned input 432 and output 434 resonators of the topology of the first preferred embodiment of the invention (FIG. 7). The values of $C_{s1}$ 431 and $C_{s2}$ 433 are very small relative to the values of the shunt capacitors $C_{P1}$ 76 and $C_{P2}$ 78. While the addition of such series capacitors would likely be counterintuitive to one of ordinary skill in the art, the addition of $C_{s1}$ 431 and $C_{s2}$ 433 actually even further improves the response of the band-pass filter of the first preferred embodiment significantly. This addition of two very inexpensive components alters the band-pass filter from a fourth-order filter to a sixth-order filter. This can be seen by comparing the resulting transfer function for the implementation of the parallel double-tuned topology of the present invention (FIG. 7) with the modified topology of FIG. 10a.

The transfer function for the topology of FIG. 7 is given by the equation $$H(s) = g_0 \cdot \frac{s^3}{(s^2 + a_1 s + b_1) \cdot (s^2 + a_2 + b_2)}.$$

The transfer function for the enhanced topology of FIG. 10a is $$H(s) = g_p \cdot \frac{s^3}{(s^3 + c_1 s^2 + d_1 s + e_1) \cdot (s^3 + c_2 s^2 + d_2 s + e_2)}.$$

(Where s=complex frequency (i.e. σ+jω), $g_o$ and $g_p$ are constants, and $a_1$, $b_1$, $a_2$, $b_2$, $c_1$, $d_1$, $e_1$, $c_2$, $d_2$ and $e_2$ are polynomial coefficients). The poles added to the transfer function defining the modified filter's frequency response increase the roll-off from the pass-band to the stop-band at high frequencies by changing the slope from 1/s (as s→∞) to $1/s^3$. Thus, not only is the $Q_L$ still further increased, but the attenuation at high frequencies is also enhanced. Finally, $C_{s1}$ 431 and $C_{s2}$ 433 also improve the low frequency performance of the filter.

Figure 11:
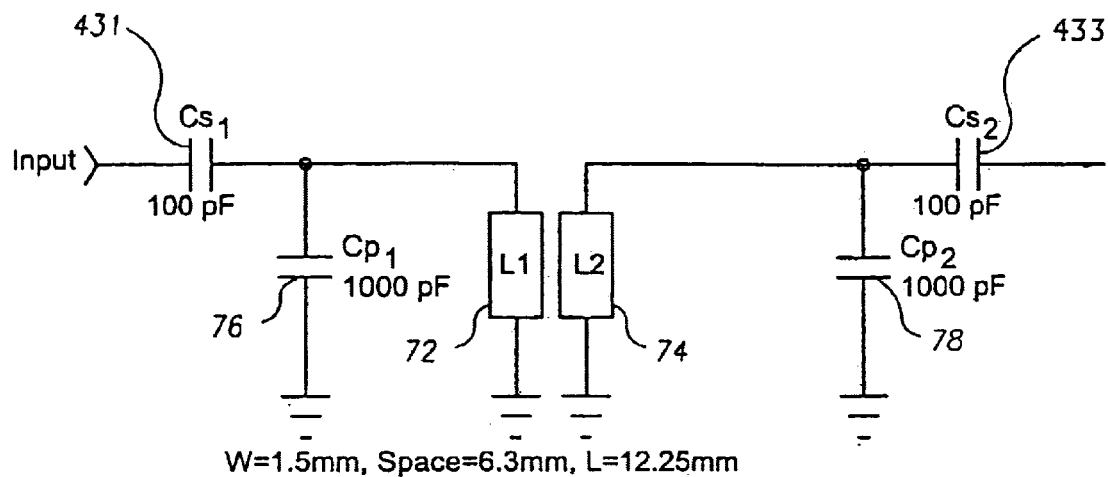
FIG. 11 illustrates an embodiment of the circuit of FIGS. 10 and 11 giving values for the components to achieve a 70 MHz narrow band-pass filter.
Figure 12A:
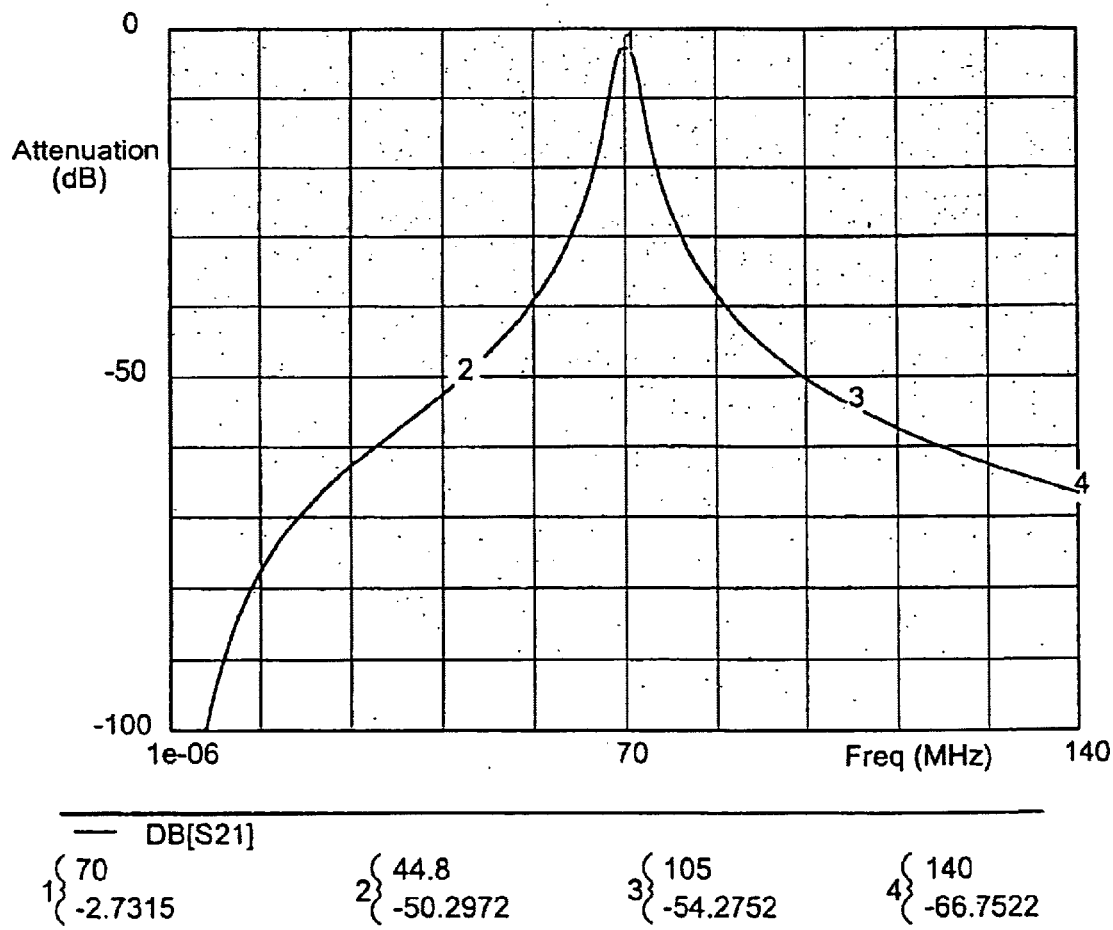
FIG. 12a is a simulated response for the resonator of FIG. 11 using a broad scale for both frequency (40 MHz/div.) and attenuation (10 dB/div.).
Figure 12B:
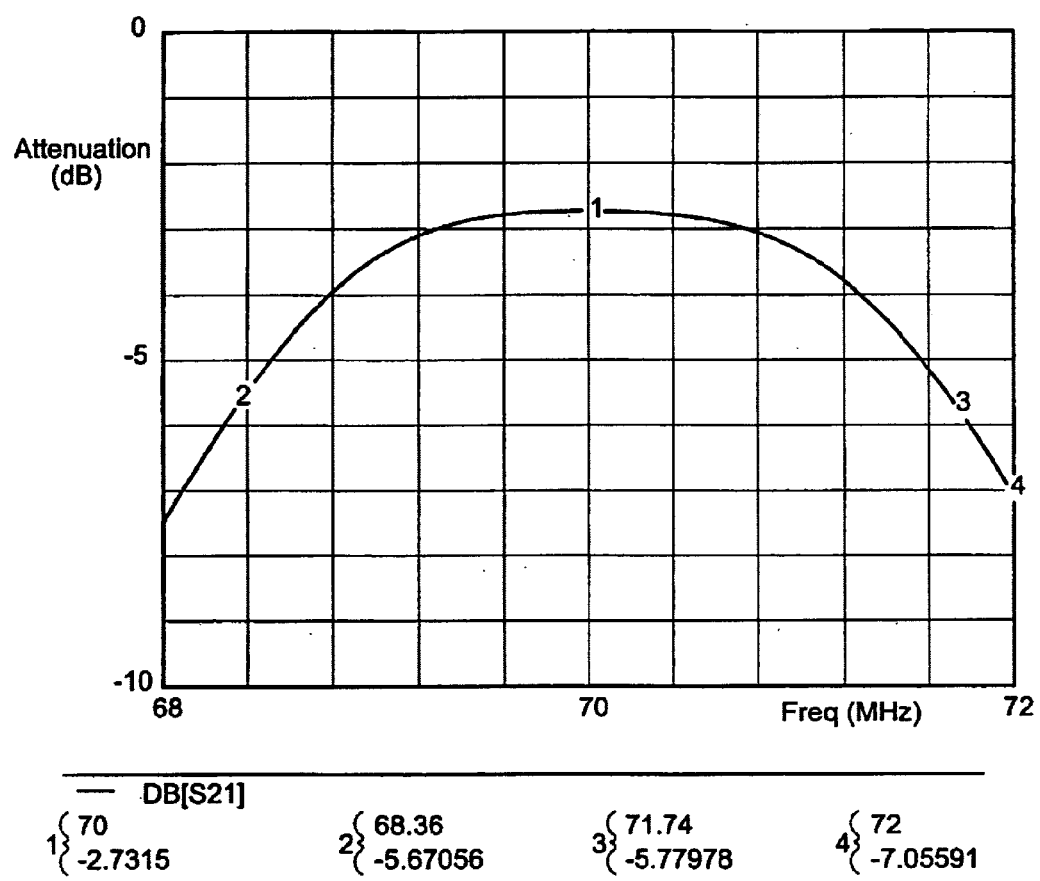
FIG. 12b is the simulated response for the resonator of FIG. 11 using a smaller scale for both frequency (10 MHz/div.) and attenuation (1 dB/div.).

An implementation for a band-pass circuit having a center frequency of 70 MHz using the topology of FIG. 10a (including the micro-strip transmission lines of the first preferred embodiment) is shown in FIG. 11. A simulated output response of the filter of FIG. 11 is illustrated in FIGS. 12a and 12b. The $Q_L$ for this circuit is about 21; the fractional bandwidth is about 4.8%.

Figure 13:
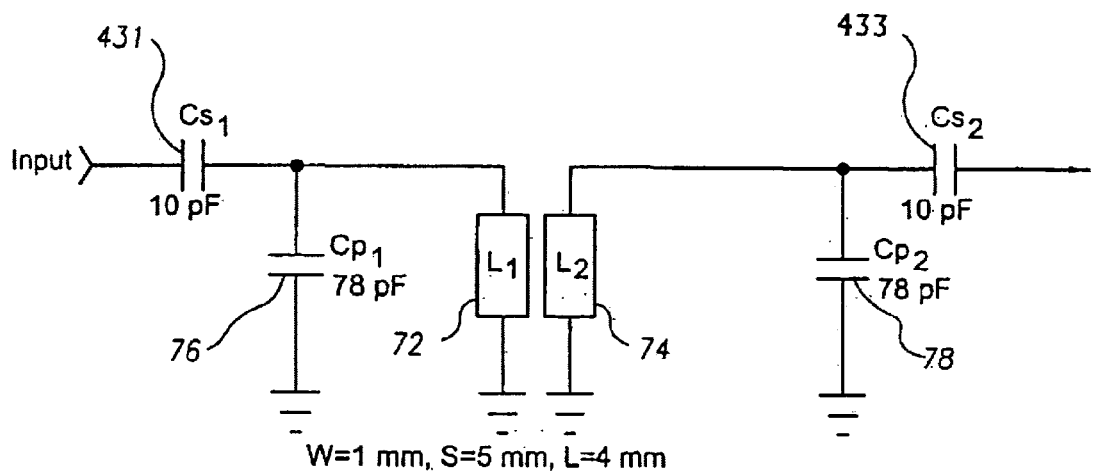
FIG. 13 illustrates an embodiment of the parallel tuned resonator of FIG. 10a with component values to achieve a 400 MHz narrow band-pass filter
Figure 14A:
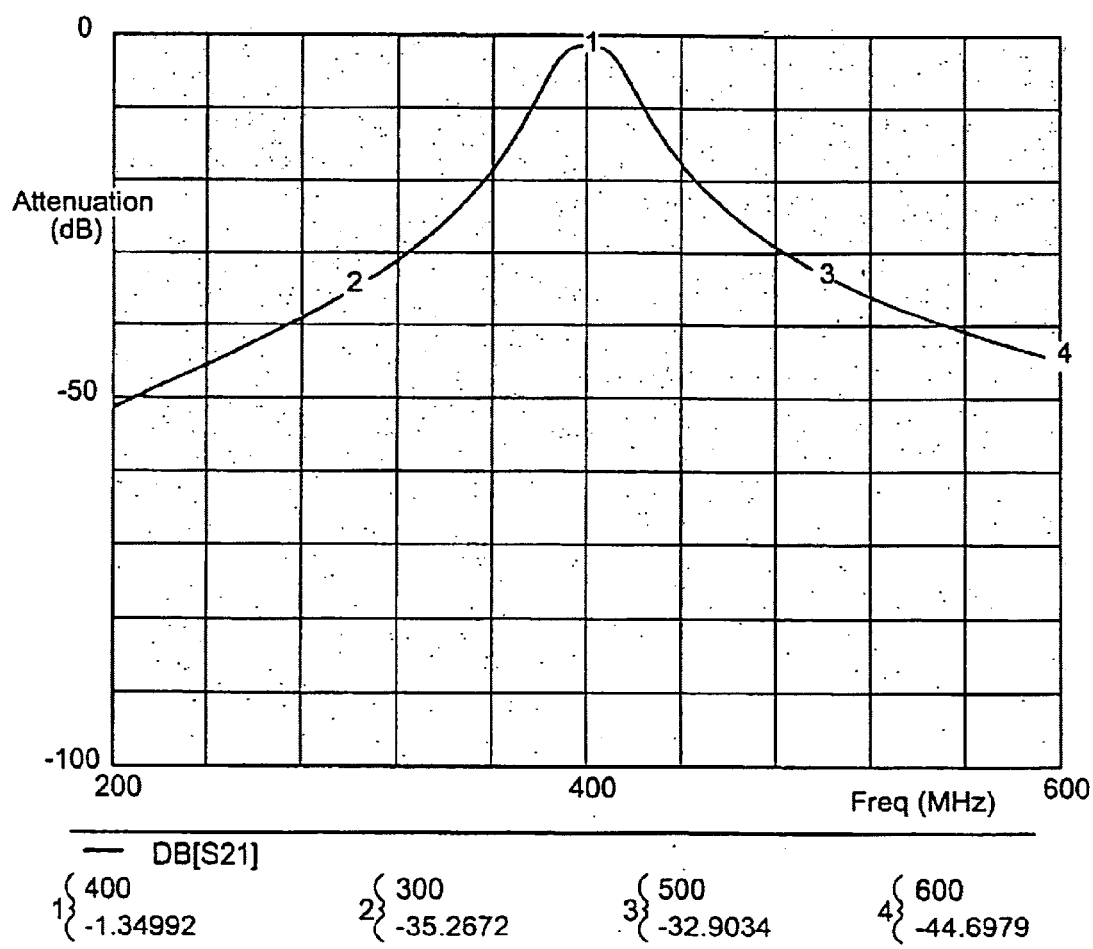
FIG. 14a is a simulated response for the resonator of FIG. 13 using a broad scale for both frequency (40 MHz/div.) and attenuation (10 dB/div.).
Figure 14B:
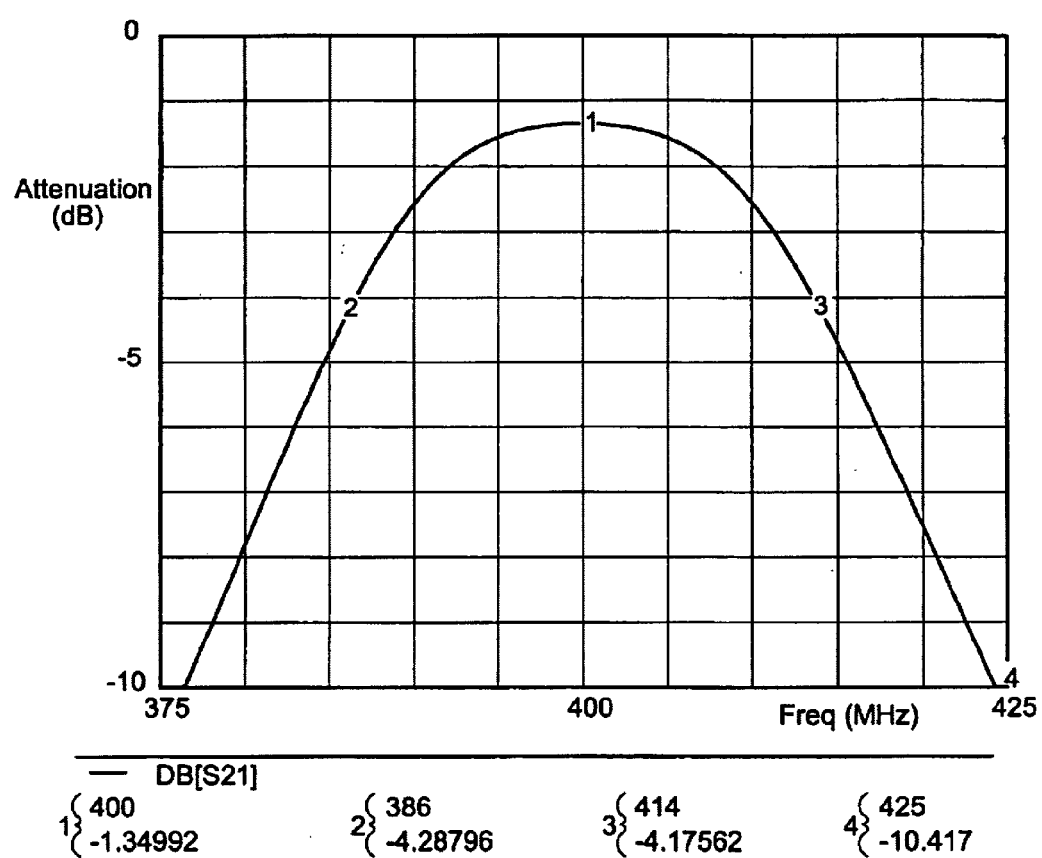
FIG. 14b is the simulated response for the resonator of FIG. 13 using a smaller scale for both frequency (10 MHz/div.) and attenuation (1 dB/div.).

An implementation for a band-pass circuit having a center frequency of 400 MHz using the topology of FIG. 10a (including the micro-strip transmission lines of the first preferred embodiment) is shown in FIG. 13. A simulated output response of the filter of FIG. 13 is illustrated in FIGS. 12a and 12b. The $Q_L$ for this circuit is about 21; the fractional bandwidth is about 4.8%.

Figure 15:
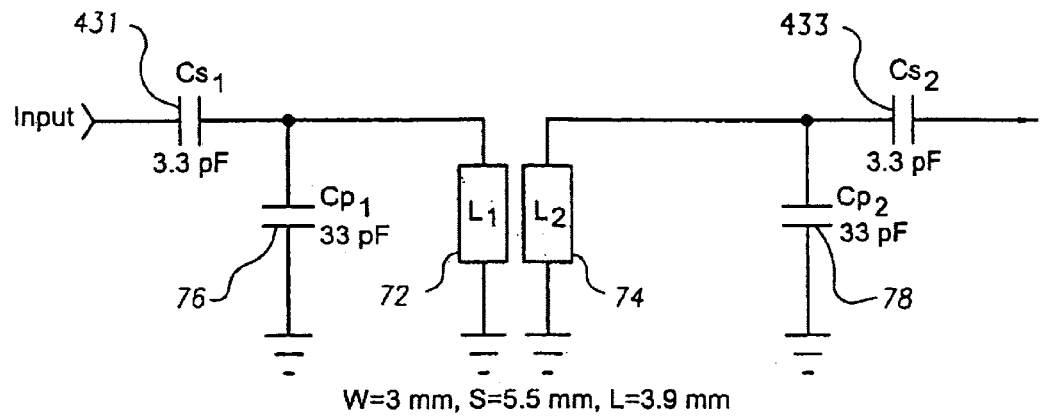
FIG. 15 is an illustration of an embodiment of the parallel tuned resonator of FIG. 10a with component values to achieve an 800 MHz band-pass filter.
Figure 16A:
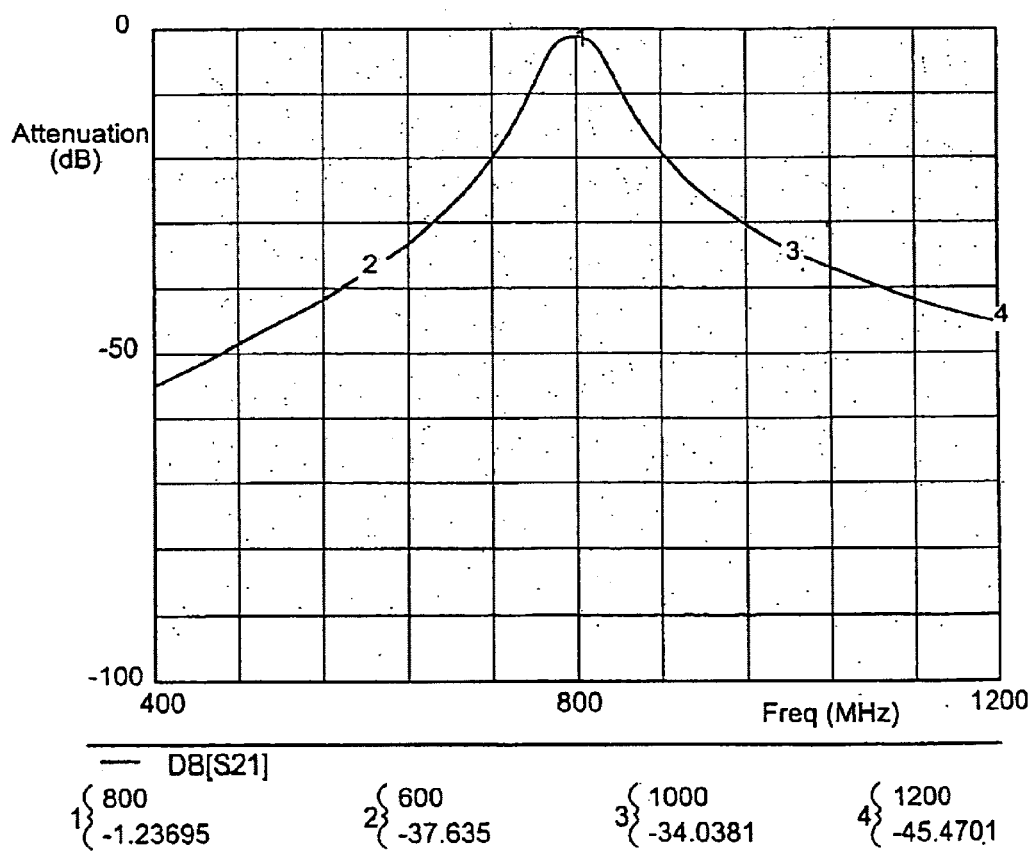
FIG. 16a is a simulated response for the resonator of FIG. 15 using a broad scale for both frequency (40 MHz/div.) and attenuation (10 dB/div.).
Figure 16B:
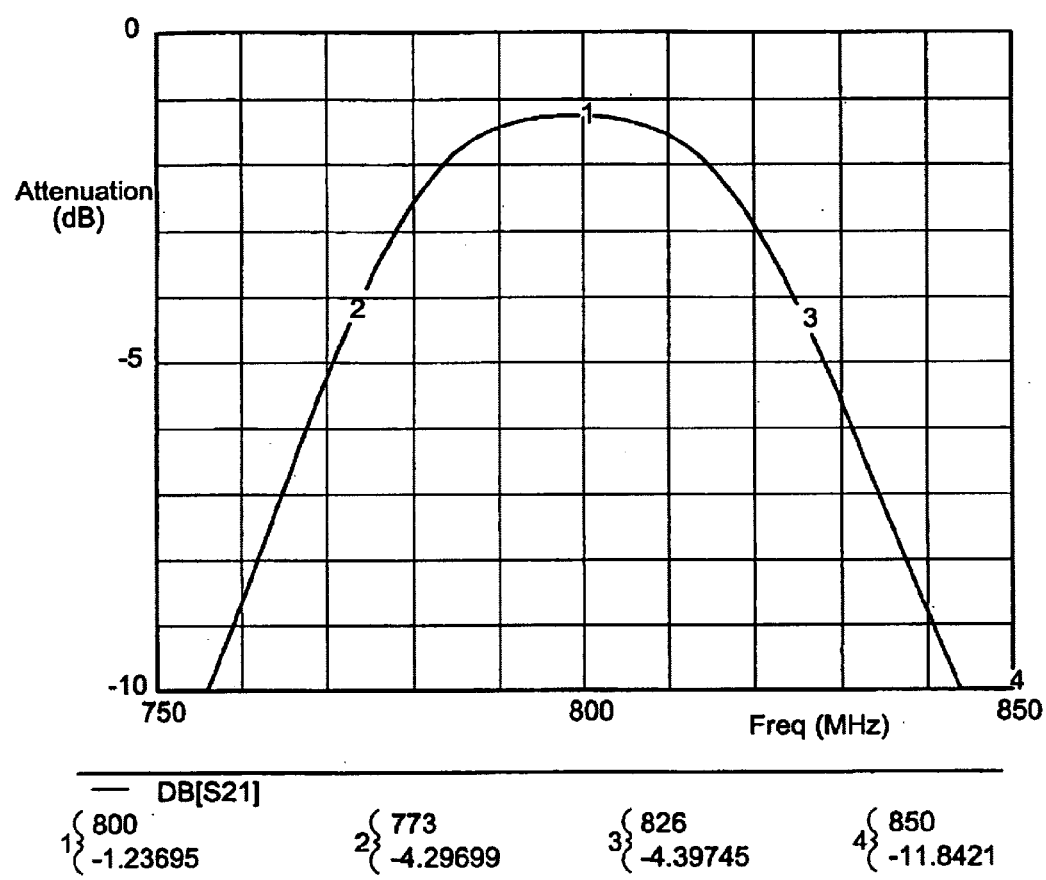
FIG. 16b is the simulated response for the resonator of FIG. 15 using a smaller scale for both frequency (10 MHz/div.) and attenuation (1 dB/div.).

An implementation for a band-pass circuit having a center frequency of 800 MHz using the topology of FIG. 10a (including the micro-strip transmission lines of the first preferred embodiment) is shown in FIG. 15. A simulated output response of the filter of FIG. 15 is illustrated in FIGS. 16a and 16b. The $Q_L$ for this circuit is about 15; the fractional bandwidth is about 6.6%.

Figure 8B:
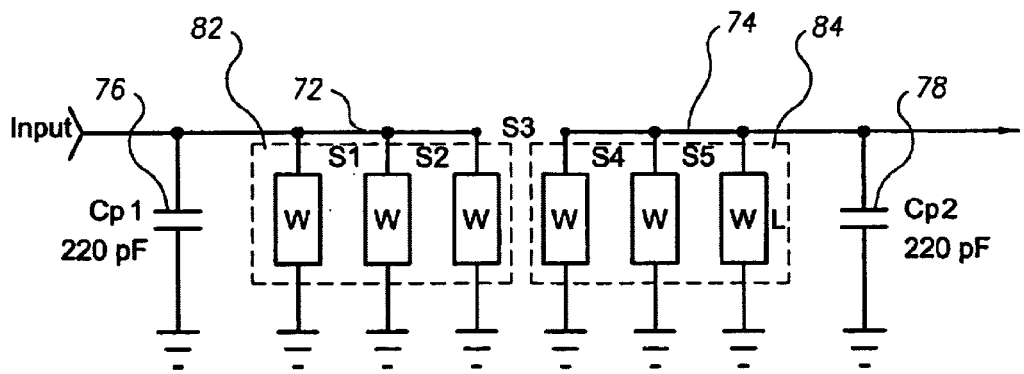
FIG. 8b is an example of the parallel resonator of FIG. 7 wherein the inductance elements are split into three parallel micro-strips as illustrated in FIG. 8a to achieve a low effective inductance for the resonators.
Figure 17:
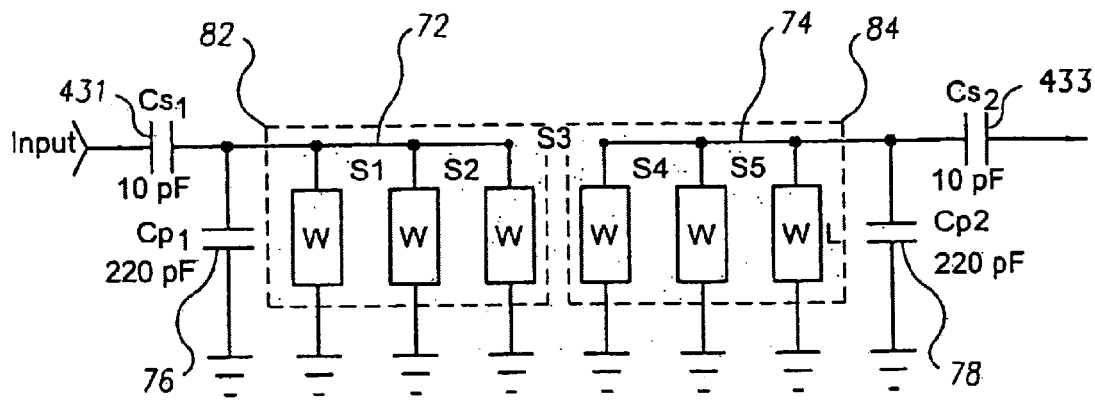
FIG. 17 illustrates an embodiment of the parallel tuned resonator of FIG. 10a for which the inductive elements for each resonator are implemented with three microstrips in parallel, to further reduce the inductance values for the resonators.
Figure 18A:
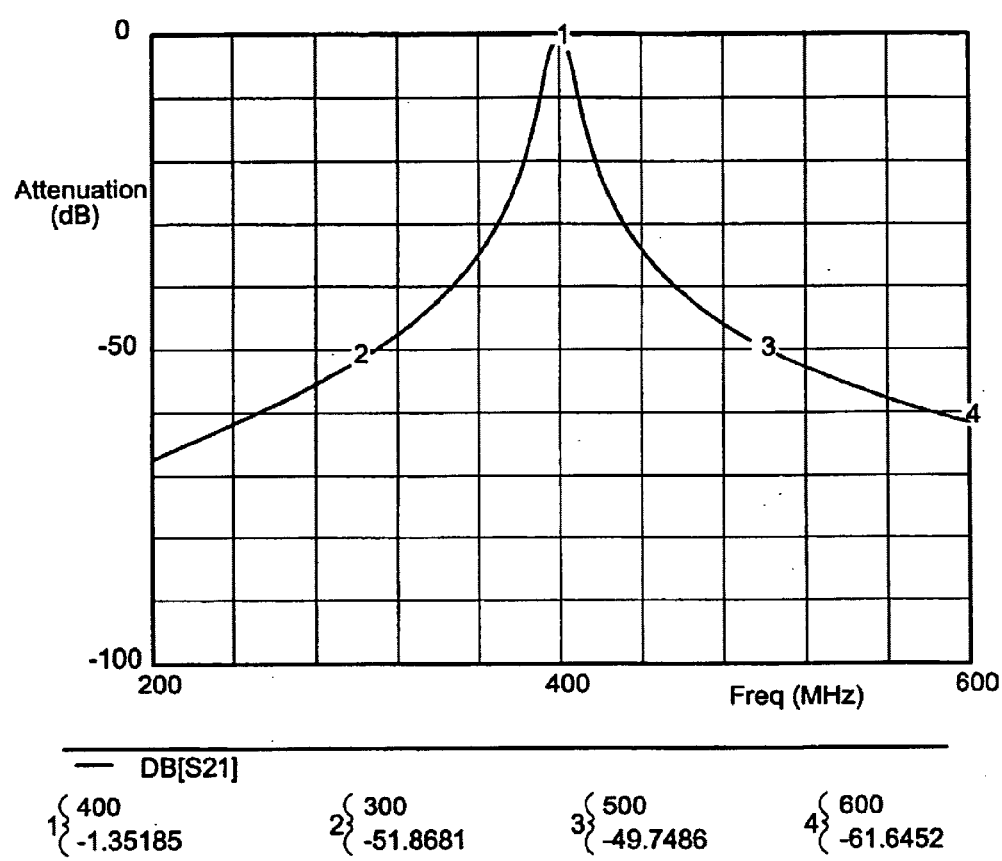
FIG. 18a is a simulated response for the resonator of FIG. 17 using a broad scale for both frequency (40 MHz/div.) and attenuation (10 dB/div.).
Figure 18B:
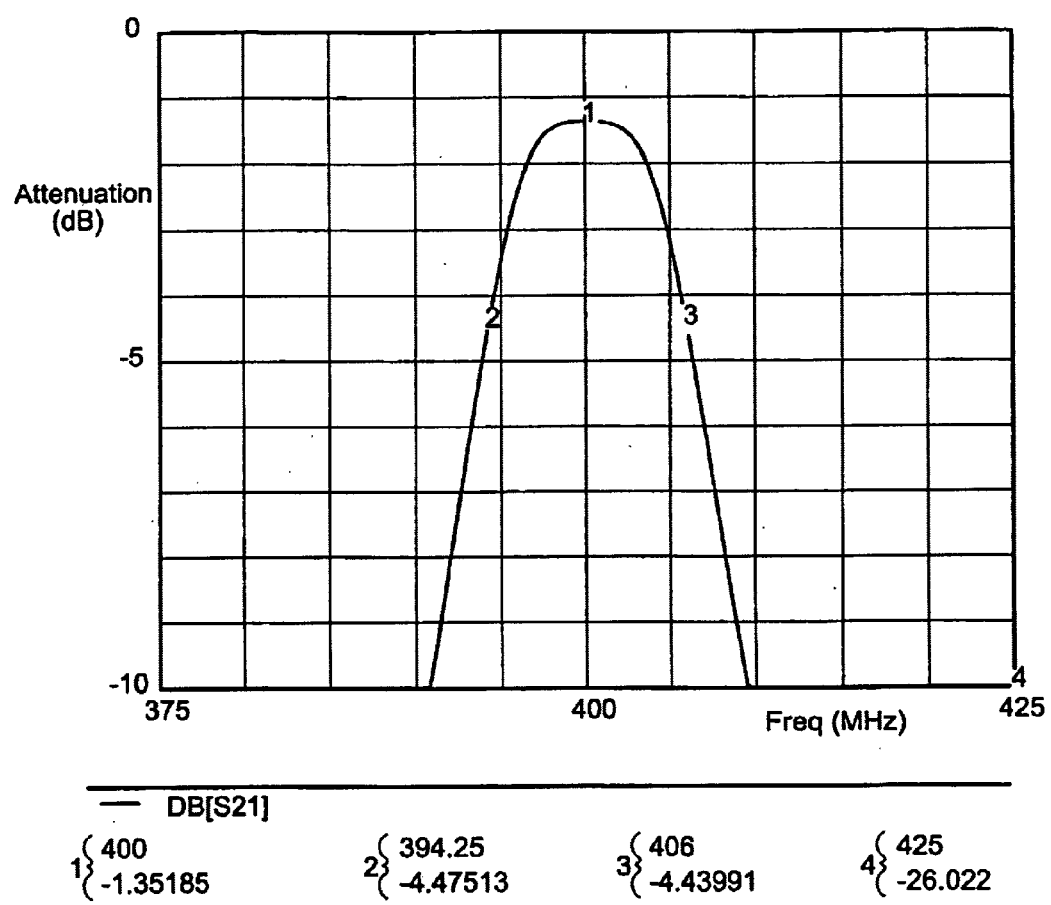
FIG. 18b is the simulated response for the resonator of FIG. 17 using a smaller scale for both frequency (10 MHz/div.) and attenuation (1 dB/div.).

An implementation for a band-pass circuit having a center frequency of 400 MHz using the topology of FIG. 10a (but including the multi micro-strip transmission lines in parallel of FIGS. 8a and 8b) is shown in FIG. 17. A simulated output response of the filter of FIG. 17 is illustrated in FIGS. 18a and 18b. The $Q_L$ for this circuit is about 34; the fractional bandwidth is about 2.9%.

Figure 19:
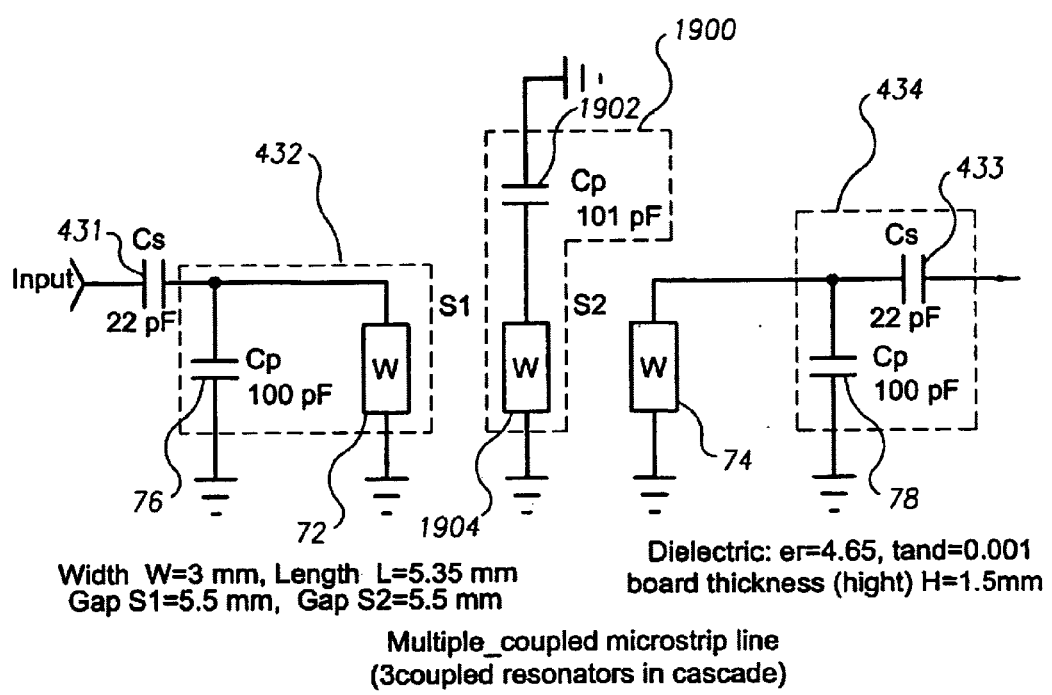
FIG. 19 illustrates an embodiment of the parallel tuned resonator of FIG. 10a having three resonators in parallel to achieve a narrow band-pass filter at 400 MHz.
Figure 20A:
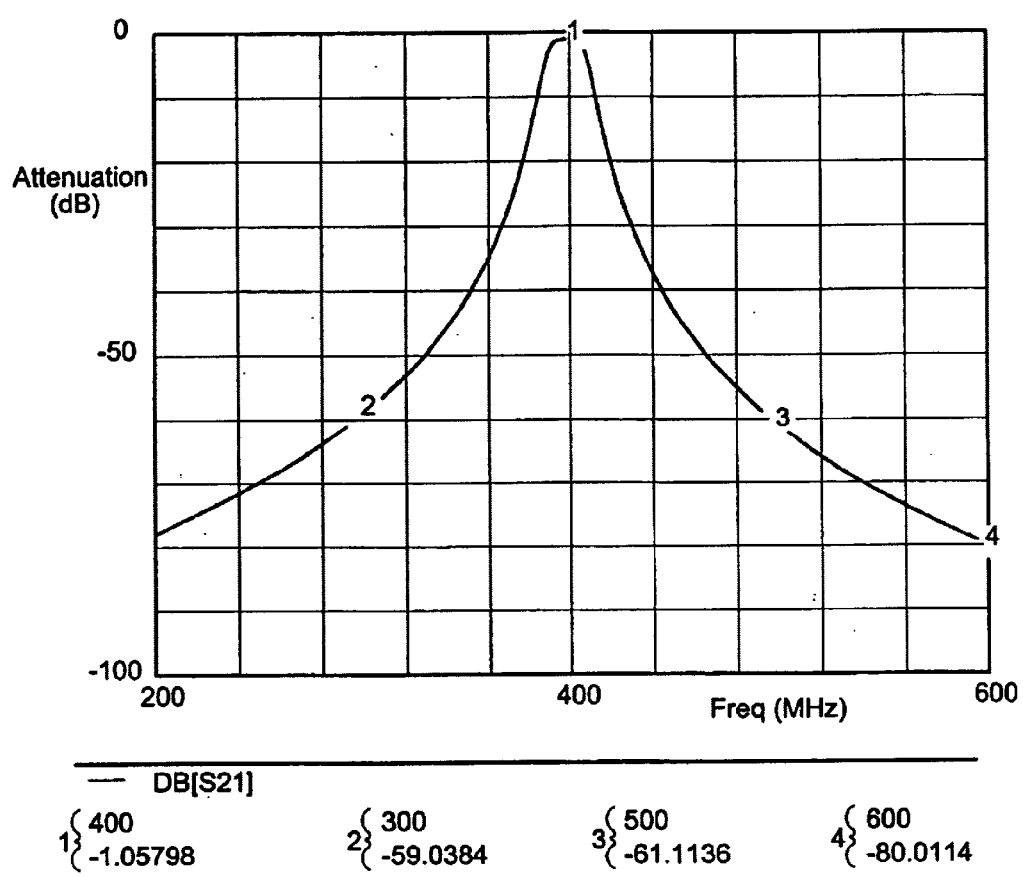
FIG. 20a is a simulated response for the resonator of FIG. 19 using a broad scale for both frequency (40 MHz/div.) and attenuation (10 dB/div.).
Figure 20B:
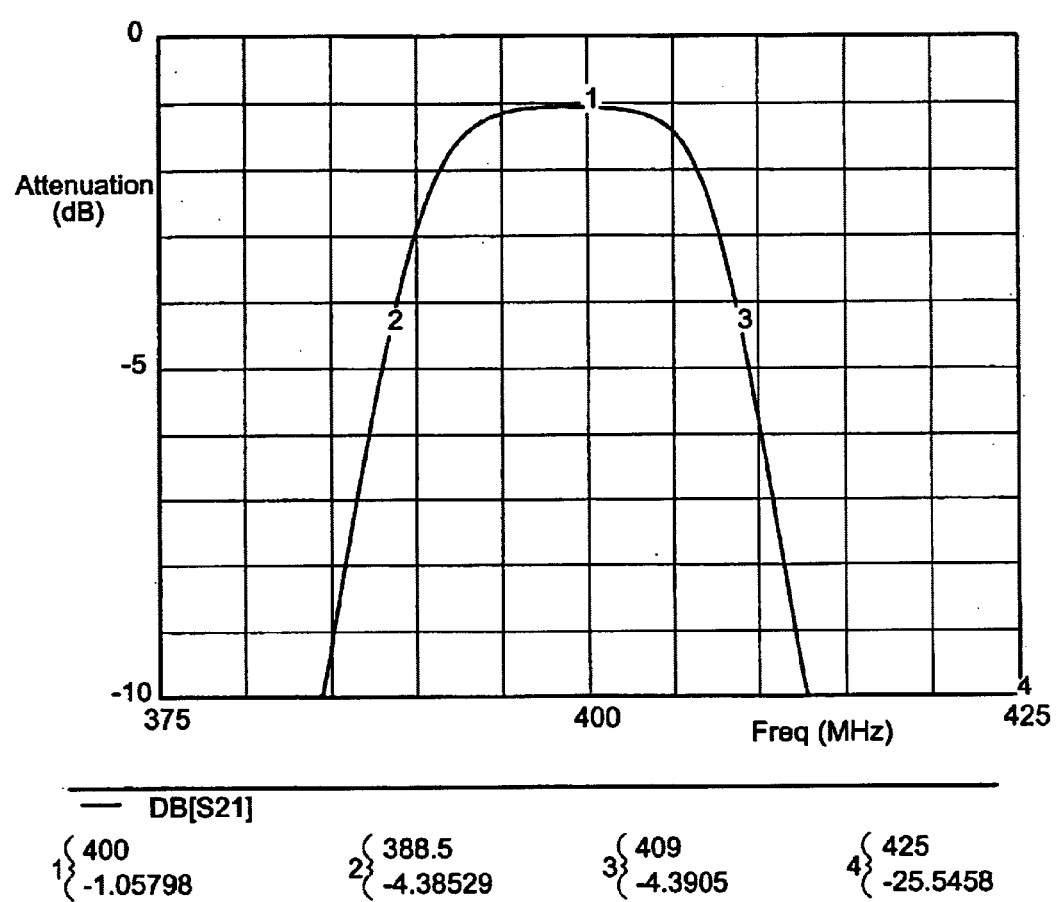
FIG. 20b is the simulated response for the resonator of FIG. 19 using a smaller scale for both frequency (10 MHz/div.) and attenuation (1 dB/div.).

An implementation for a band-pass circuit having a center frequency of 400 MFz and using the topology of FIG. 10a (including the micro-strip transmission lines of the first preferred embodiment) is shown in FIG. 19 wherein an additional resonator 1900 is coupled between input and output resonators 432, 434. Resonator 1900 is of the same topology as resonators 432, 434, having a capacitor $C_{P3}$ 1902 in parallel with a micro-strip inductive component 1904. A simulated output response of the filter of FIG. 19 is illustrated in FIGS. 20a and 20b. The $Q_L$ for this circuit is about 19.5; the fractional bandwidth is about 5%.

Figure 21:
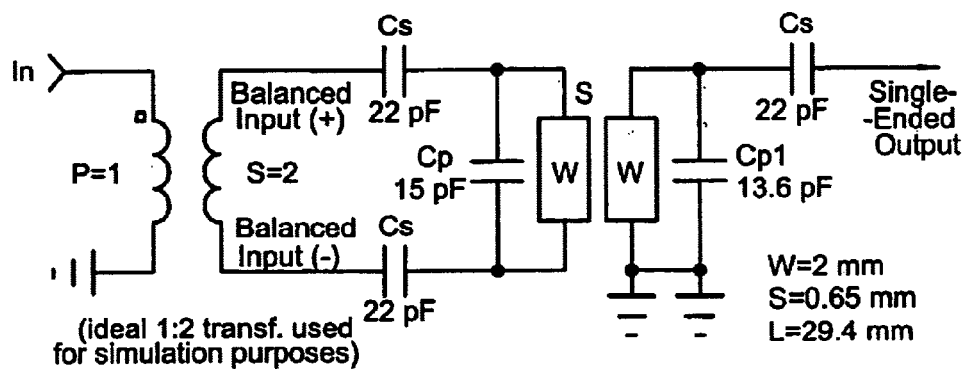
FIG. 21 is an embodiment of the parallel tuned resonator of FIG. 10a employing a balanced—unbalanced transformer to achieve a 400 MHz narrow band-pass filter.
Figure 22A:
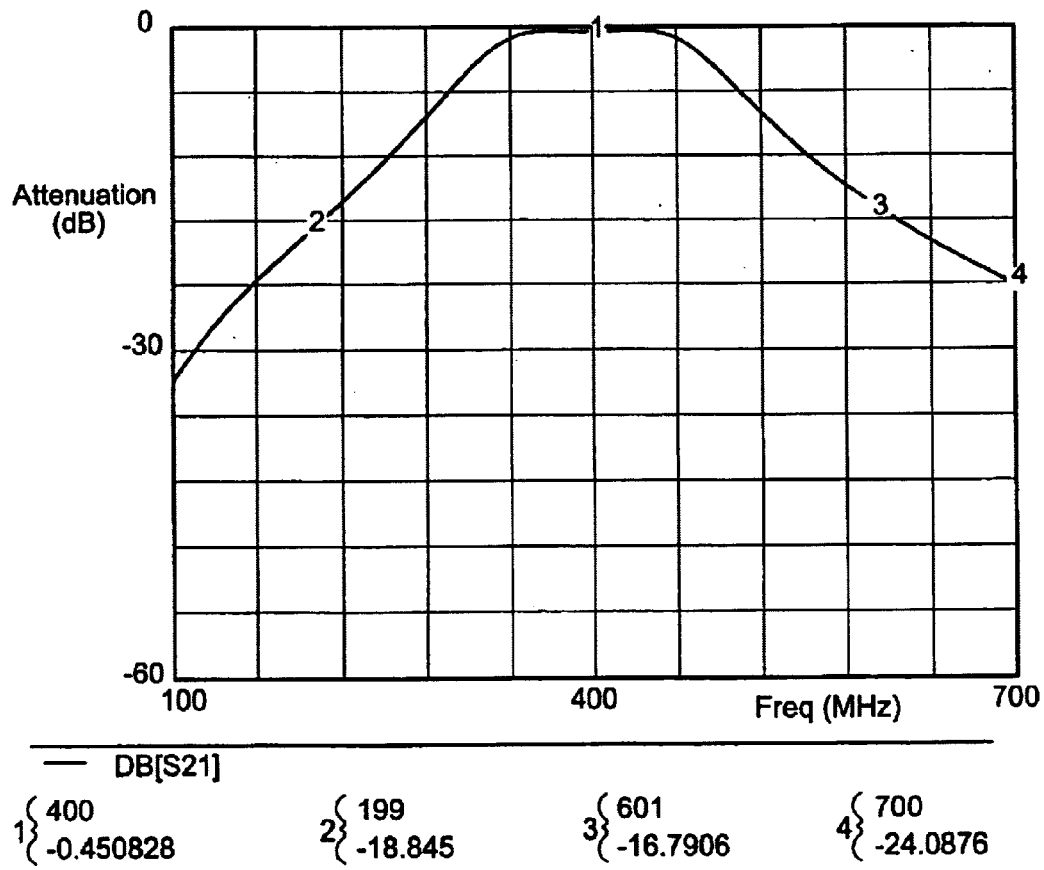
FIG. 22a is a simulated response for the resonator of FIG. 21 using a broad scale for both frequency (40 MHz/div.) and attenuation (10 dB/div.).
Figure 22B:
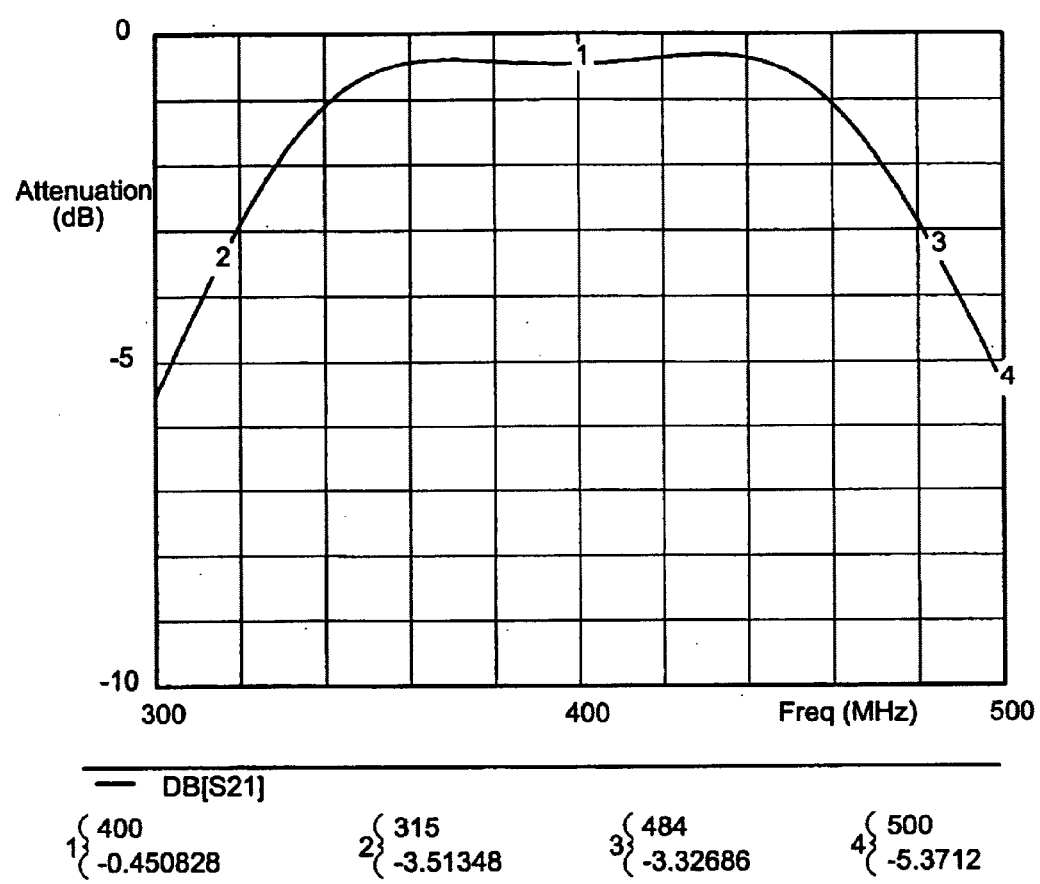
FIG. 22b is the simulated response for the resonator of FIG. 21 using a smaller scale for both frequency (10 MHz/div.) and attenuation (1 dB/div.).

An implementation for a wide band band-pass filter circuit having a center frequency of 400 MHz and using the topology of FIG. 10a (including the micro-strip transmission lines of the first preferred embodiment) is shown in FIG. 21. The circuit comprises a balanced input for the input resonator 432 and an unbalanced output for the output resonator 434 (or vice versa). This circuit can be used as a signal combiner or as a signal splitter within the pass-band frequency range. A simulated output response of the filter of FIG. 21 is illustrated in FIGS. 22a and 22b. The $Q_L$ for this circuit is about 2.4; the fractional bandwidth is about 42%.

Figure 23:
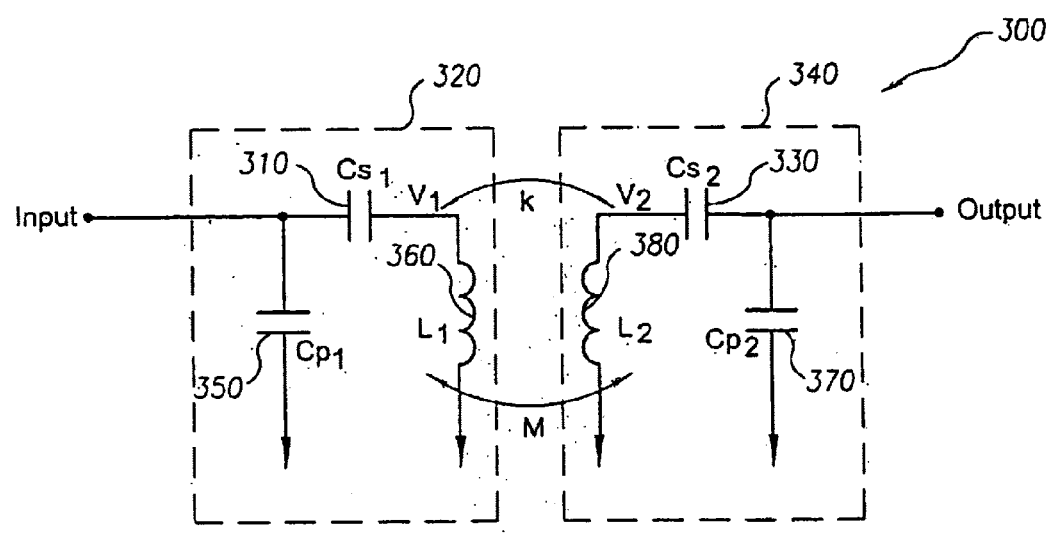
FIG. 23 is an illustration of a series tuned resonator using air coils as inductive elements, and having additional capacitors in parallel between the input and output signals and the resonators.

FIG. 23 illustrates a third preferred embodiment of the invention, wherein an additional capacitor ($C_{p1}$ 350 and $C_{p2}$ 370 respectively) is added in parallel with the series tuned input 320 and output 340 resonators of the prior art topology of FIG. 3. The values of $C_{p1}$ 350 and $C_{p2}$ 370 are very large relative to the values of the series capacitors $C_{s1}$ 11 and $C_{s2}$ 13 of FIG. 1a. While the addition of such parallel capacitors would likely be counterintuitive to one of ordinary skill in the art, the addition of $C_{p1}$ 350 and $C_{p2}$ 370 actually further improves the response of the band-pass filter of the prior art topology of FIGS. 1a and 3 significantly. This addition of two very inexpensive components alters the band-pass filter from a fourth-order filter to a sixth-order filter in the same way that the addition of series capacitors to the parallel tuned circuit of FIG. 1b and FIG. 5 did. The resulting transfer function for the implementation of the present invention with the modified topology of FIG. 23 is the basically the same as that for the topology of FIG. 10a disclosed above. This is because they are theoretical duels of each other.

Figure 24:
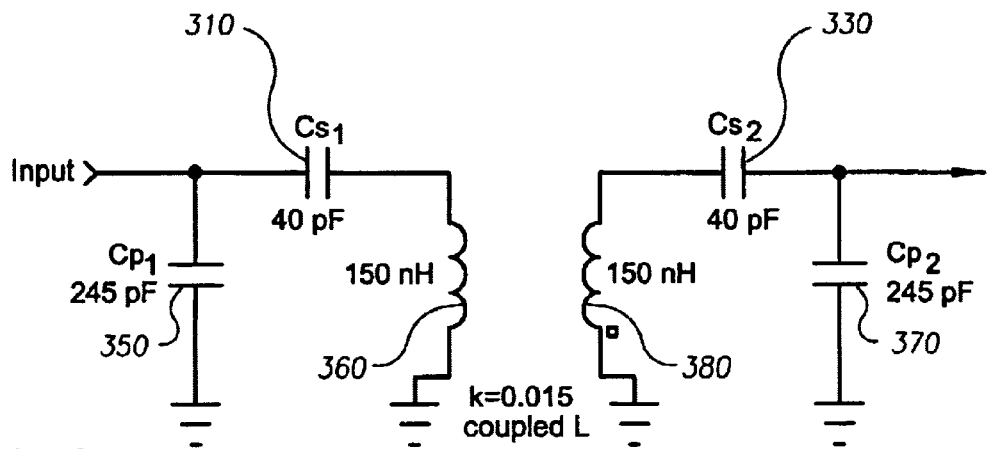
FIG. 24 is an illustration of an embodiment of the series tunes resonator of FIG. 23. having component values to achieve a 70 MHz narrow band-pass filter.
Figure 25A:
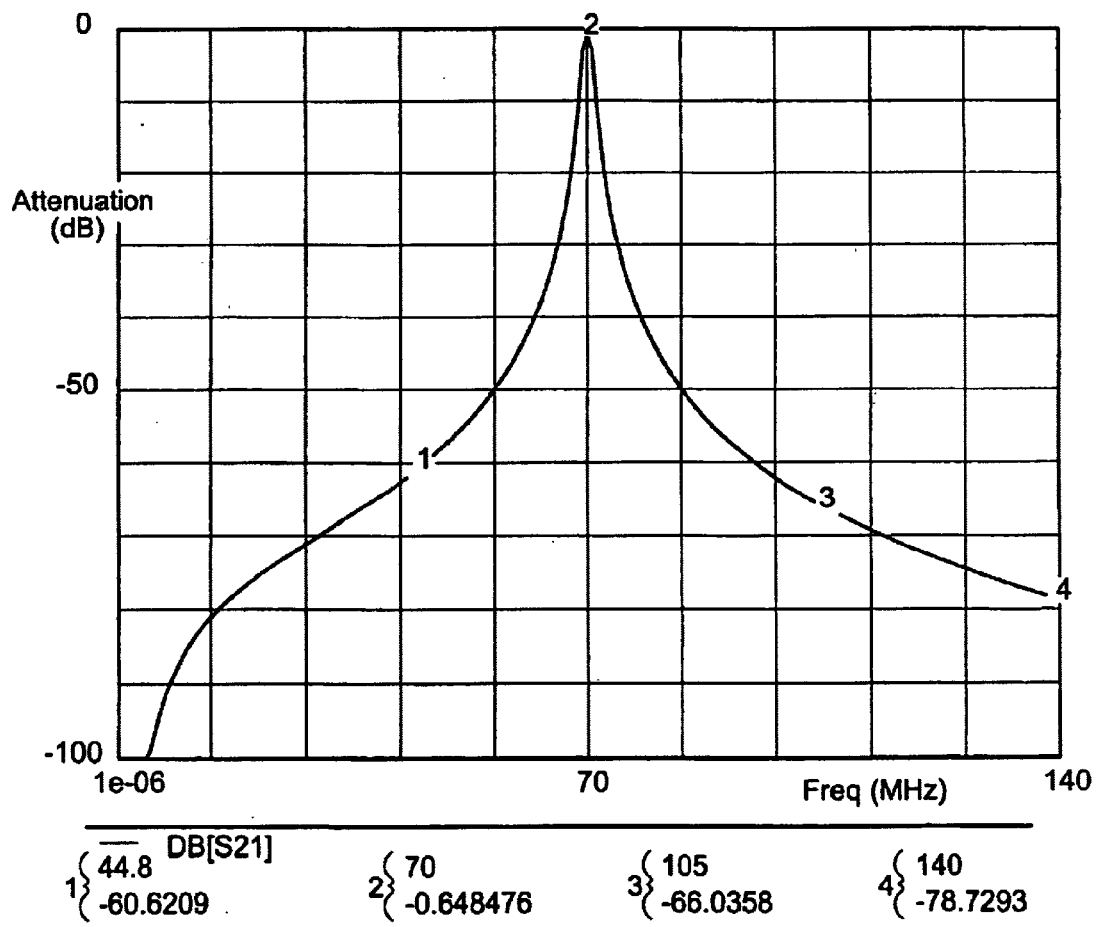
FIG. 25a is a simulated response for the resonator of FIG. 24 using a broad scale for both frequency (40 MHz/div.) and attenuation (10 dB/div.).
Figure 25B:
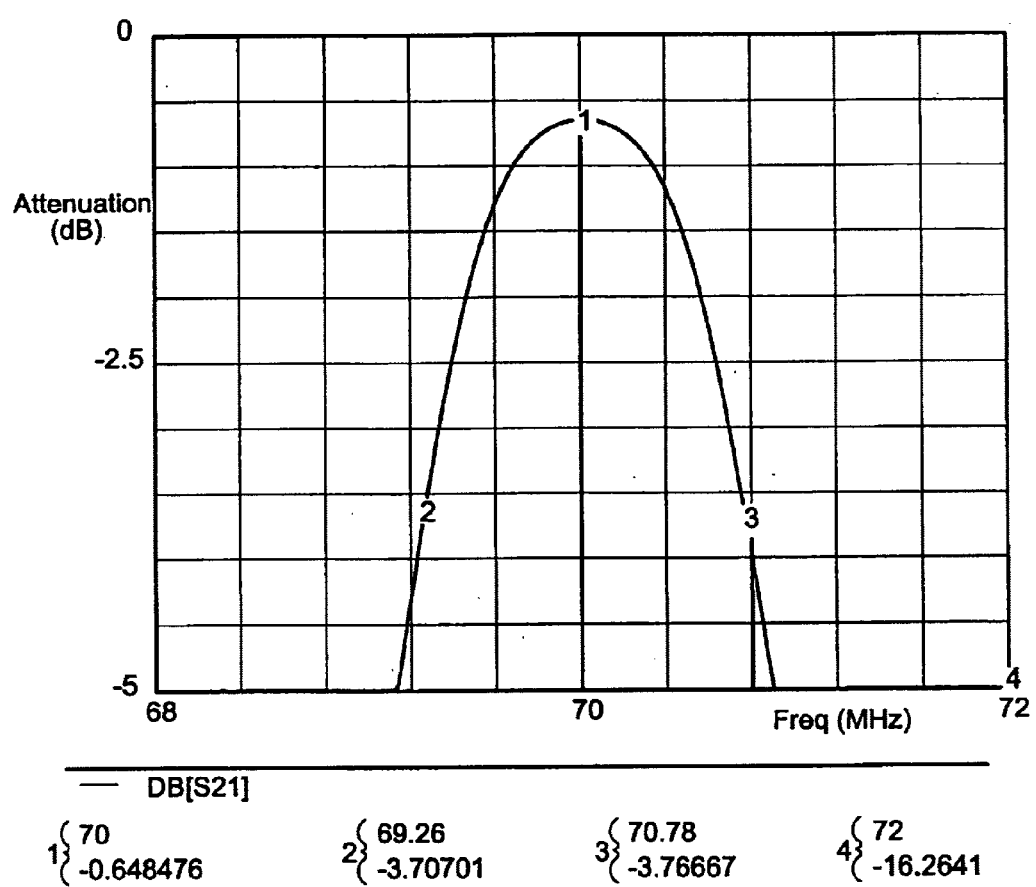
FIG. 25b is the simulated response for the resonator of FIG. 24 using a smaller scale for both frequency (10 MHz/div.) and attenuation (1 dB/div.).

An implementation for a band-pass circuit having a center frequency of 70 MHz and using the topology of FIG. 23 (using air coils for inductors to achieve the higher inductance values required for high $Q_L$) is shown in FIG. 24. A simulated output response of the filter of FIG. 24 is illustrated in FIGS. 25a and 25b. The $Q_L$ for this circuit is about 46; the fractional bandwidth is about 2.2%.

Figure 26:
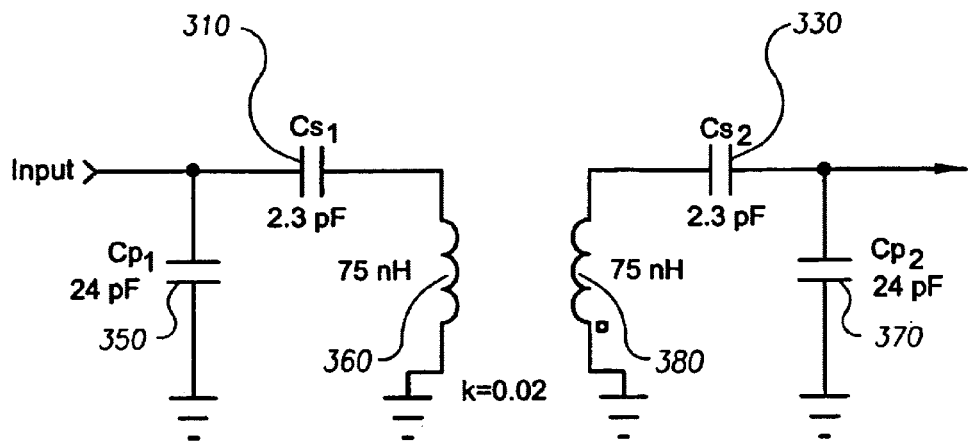
FIG. 26 is an illustration of an embodiment of the series tuned circuit of FIG. 23 with component values to achieve a 400 MHz narrow band-pass filter.
Figure 27A:
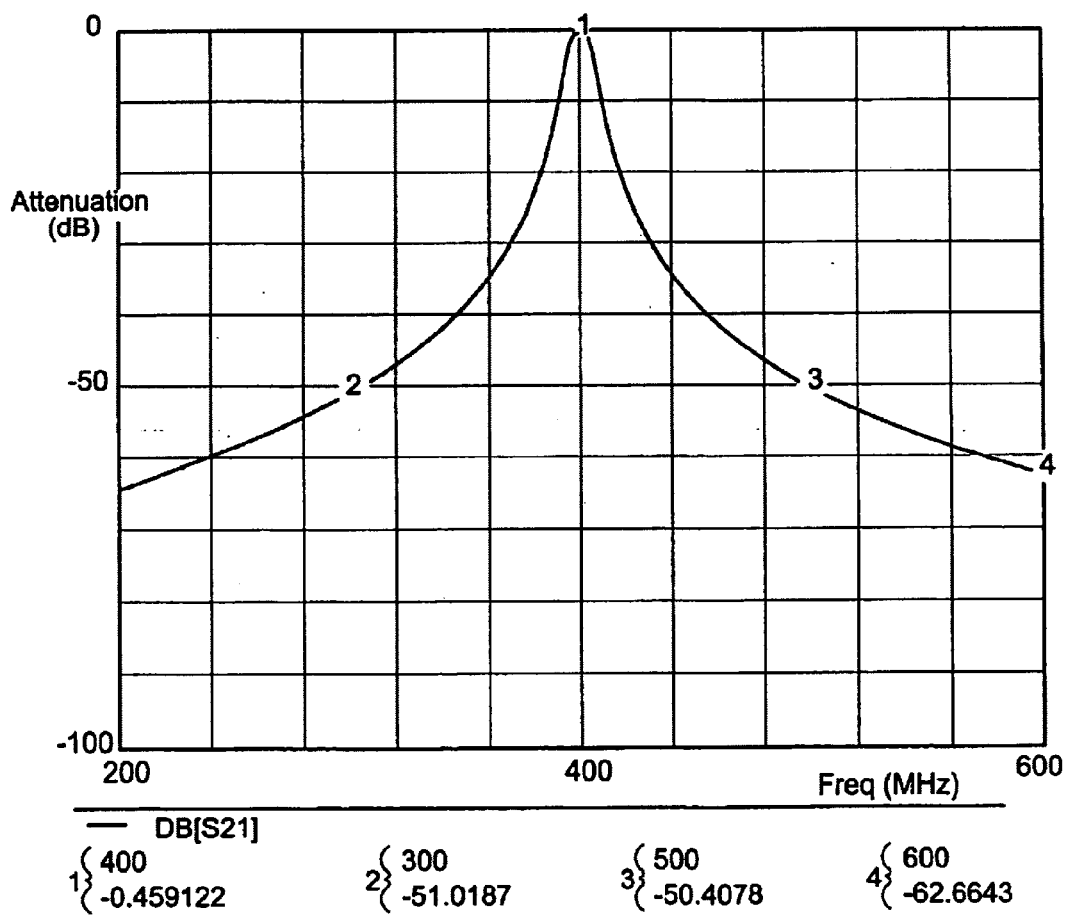
FIG. 27a is a simulated response for the resonator of FIG. 26 using a broad scale for both frequency (40 MHz/div.) and attenuation (10 dB/div.).
Figure 27B:
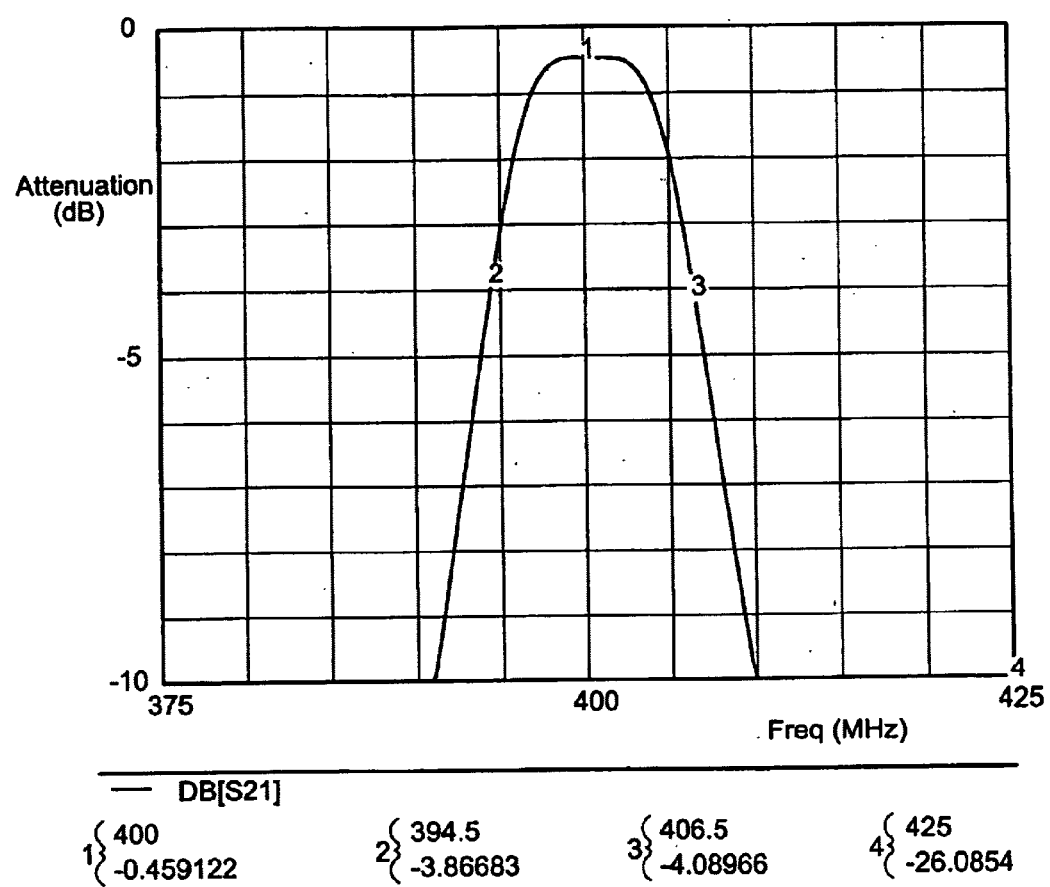
FIG. 27b is the simulated response for the resonator of FIG. 26 using a smaller scale for both frequency (10 MHz/div.) and attenuation (1 dB/div.).

An implementation for a band-pass circuit having a center frequency of 400 MHz and using the topology of FIG. 23 (using air coils for inductors to achieve the higher inductance values required for high $Q_L$) is shown in FIG. 26. A simulated output response of the filter of FIG. 26 is illustrated in FIGS. 27a and 27b. The $Q_L$ for this circuit is about 33.33; the fractional bandwidth is about 3%.

Figure 28:
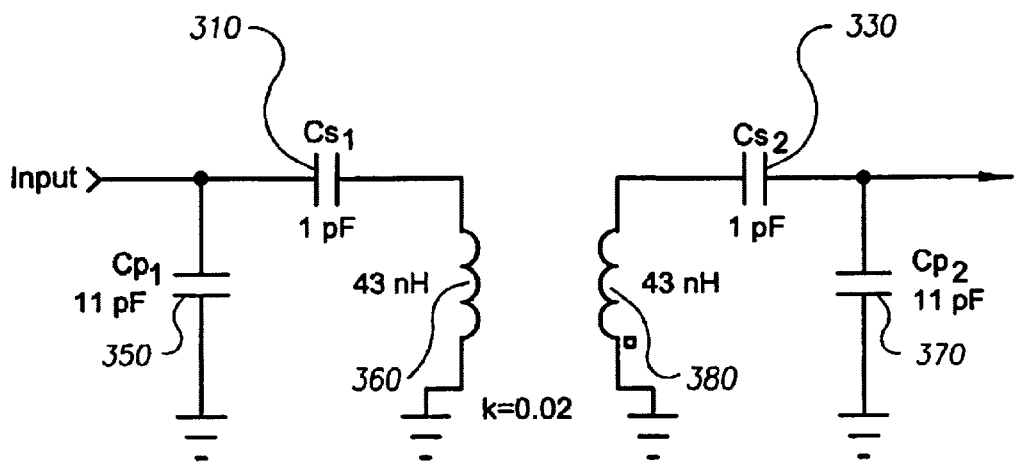
FIG. 28 is an illustration of an embodiment of the series tuned circuit of FIG. 23 with component values to achieve a 800 MHz narrow band-pass filter.
Figure 29A:
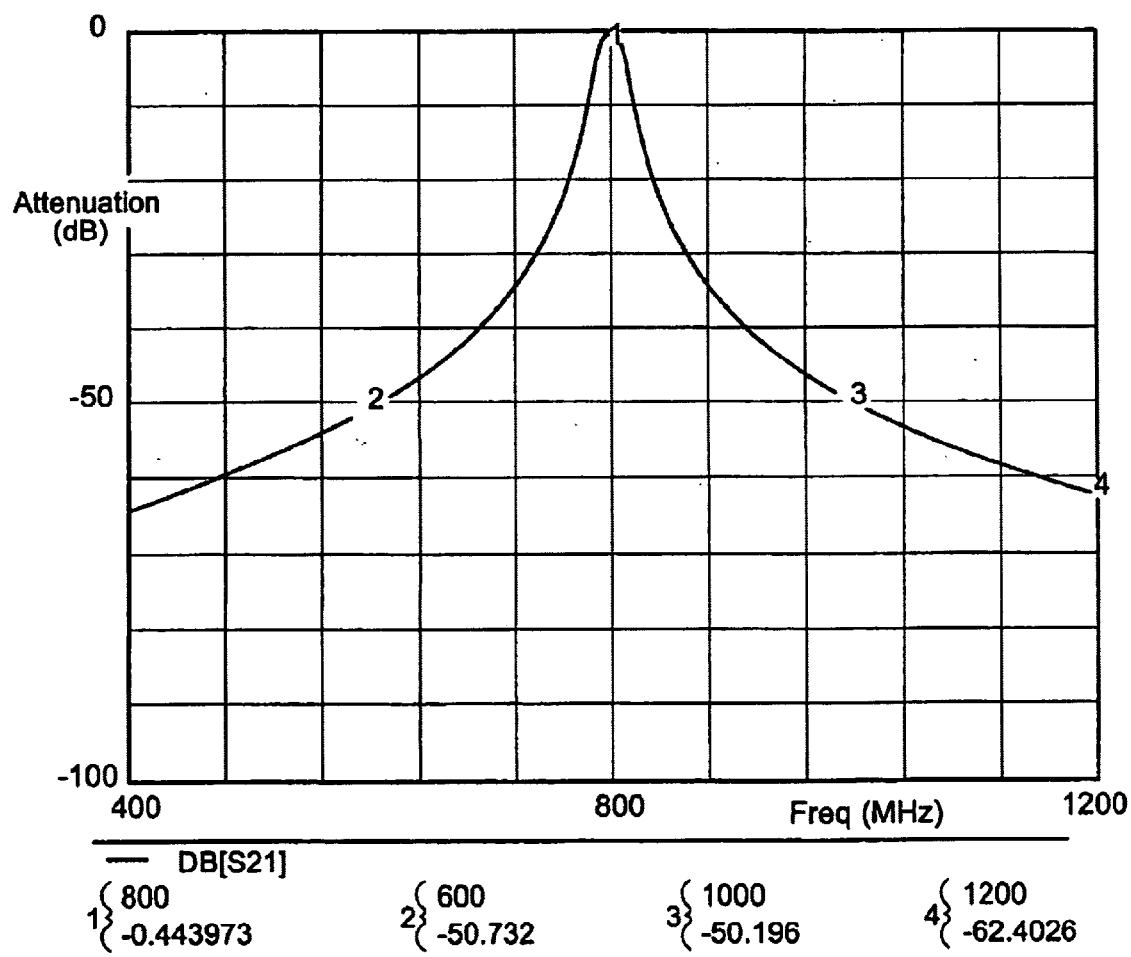
FIG. 29a is a simulated response for the resonator of FIG. 28 using a broad scale for both frequency (40 MHz/div.) and attenuation (10 dB/div.).
Figure 29B:
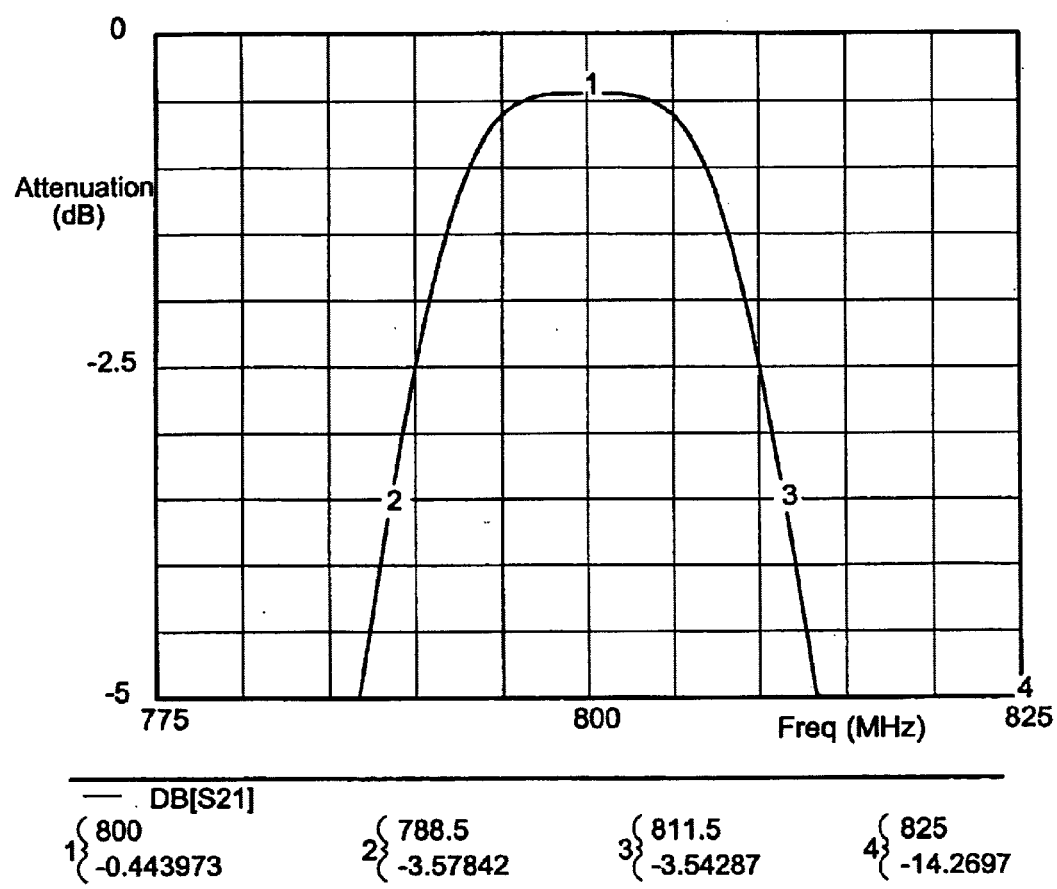
FIG. 29b is the simulated response for the resonator of FIG. 28 using a smaller scale for both frequency (10 MHz/div.) and attenuation (1 dB/div.).

An implementation for a band-pass circuit having a center frequency of 70 MHz and using the topology of FIG. 23 (using air coils for inductors to achieve the higher inductance values required for high $Q_L$) is shown in FIG. 28. A simulated output response of the filter of FIG. 28 is illustrated in FIGS. 29a and 29b. The $Q_L$ for this circuit is about 34.8; the fractional bandwidth is about 2.9%.

FIG. 30 is a table of values for the various examples of implementations of the parallel double-tuned topology employing the micro-strip lines for the inductor components of the circuit, including the dimensions and other pertinent information.

As frequency increases beyond about 1 GHz, the inductive coupling increases passed the point at which a reduction in the mutual inductance M can be practicably used to compensate for the increase in inductive coupling to maintain optimal coupling by simply increasing the spacing between the resonators. Moreover, the increase in frequency decreases the $Q_L$ beyond the point where it is practical to simply shorten the lengths of the metal strips to decrease the value of the effective inductance L for each resonator (of the parallel tuned implementations of either FIG. 7 or 10a). In the case of the preferred embodiments as manufactured using standard printed circuit board manufacturing tolerances, the minimum length is typically about 5 mm. As the lengths of the strips become dominated by the tolerances of the manufacturing process, the inaccuracy reflected in the filter response becomes intolerable given the small fractional bandwidths required by the applications of interest. Further, as previously discussed there is a limit to the number of elements that can be placed directly in parallel for lowering the effective inductance for each resonator.

Figure 32A:
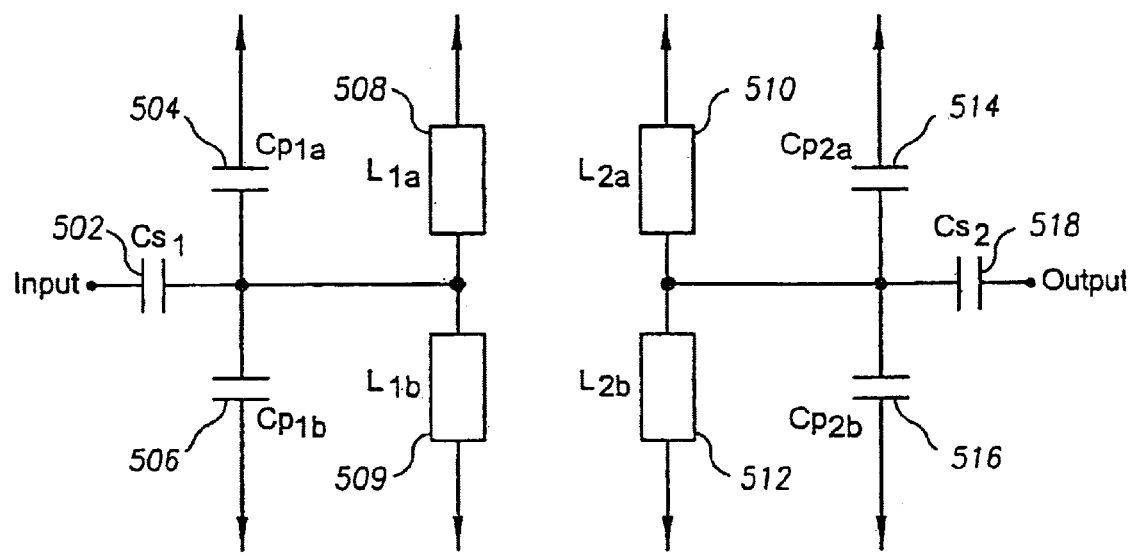

Thus, a fourth embodiment of the invention is disclosed in FIG. 32a, in which each of the resonators of the original topologies (FIGS. 7 and 10a) has a mirror image of itself coupled to its signal line as shown. This topology provides two very important features that permit its application to frequencies ranging from about 500 MHz and over 2 GHz. First, it permits the effective inductance values for each resonator to be reduced even further beyond the limits to which the metal strips can be shortened based on manufacturing tolerances. The inductive elements $L_{1a}$ 508 and $L_{1b}$ 509 of the input resonator and inductive elements $L_{2a}$ 510 and $L_{2b}$ 512 of the output resonator are in parallel with one another respectively, thus reducing the effective inductance of the input and output resonators by over 50 percent.

The ability to further reduce the inductance values permits parallel capacitors $C_{P1a}$ 504, $C_{P1b}$ 506 and $C_{P2a}$ 514, $C_{P2b}$ 516 to be increased in value as the frequency is increased to offset the decrease in $Q_L$. Moreover, the effective inductance for each resonator can be even further reduced by implementing L1a 508, L1b 509, L2a 510 and L2a 512 as parallel combinations of micro-strips (606, 608, 610 and 612 respectively, FIG. 10d) as described previously in conjunction with FIGS. 8a and 30. As previously discussed, there is a practical limitation to the number of micro-strips that can be placed in parallel in this manner. The implementation illustrated in FIG. 32b produces even smaller values of inductance than can be achieved simply by placing micro-strips in parallel combinations, such as individual inductor elements 606, 608, 610 and 612.

The second important feature making this topology suitable for extended frequencies in the 1 to 2 GHz range is that this topology is anti-parallel in nature. Because the currents flowing in the inductive elements are opposite in direction, the mutual coupling between the resonators tends to cancel out, thereby substantially reducing the mutual inductance M (and therefore the overall inductive coupling) between the resonators. Thus, even at frequencies between 1 and 2 MHz and above, the coupling can be more easily maintained within an optimal range through the variation of M as a function of the proximity of the resonators in the circuit.

The manner in which the anti-parallel topology of the present invention substantially cancels out the mutual inductance between the resonators is described below with reference to FIGS. 33a–d. The analysis is made in a series of steps, assuming that the inductors have zero width. In the first step, the mutual inductance between inductive elements $L_{1a}$ 710 and $L_{2a}$ 712 is first considered as shown in FIG. 33a.

The inductance between these two inductive elements is given by the equation:

$$M_{1a,2a} = -\frac{\mu_0 b}{2\pi}\left\{\ln\left[\frac{b}{d} + \sqrt{\left(\frac{b}{d}\right)^2 + 1}\right] + \frac{d}{b} - \sqrt{\left(\frac{d}{b}\right)^2 + 1}\right\}.$$

In the second step, the mutual inductance between inductive elements $L_{1a}$ 710 and $L_{2b}$ 714 is given by the equation:

$$M_{1a,2a} = -\frac{\mu_0 b}{2\pi}\left\{\ln\left[-\frac{b}{d} + \sqrt{\left(\frac{b}{d}\right)^2 + 1}\right] - \frac{d}{b} - \sqrt{\left(\frac{d}{b}\right)^2 + 1}\right\}.$$

In the third step, the circuits of FIGS. 33a and 33b are superimposed on one another to produce the circuit shown in FIG. 33c. The equation describing the combined mutual inductances is then simply:

$$M_{1a,2b} + M_{1a,2a} =$$

$$-\frac{\mu_0 b}{2\pi}\left\{\ln\left[\left(\frac{b}{d} + \sqrt{\left(\frac{b}{d}\right)^2 + 1}\right)\left(-\frac{b}{d} + \sqrt{\left(\frac{d}{b}\right)^2 + 1}\right)\right] + 2\sqrt{\left(\frac{d}{b}\right)^2 + 1}\right\},$$

which can be further reduced to:

$$M_{1a,2b} + M_{1a,2a} = -\frac{\mu_0 b}{2\pi}\left\{\ln\left[\left(\frac{b}{d}\right)^2 + 1 - \left(\frac{b}{d}\right)^2\right] + 2\sqrt{\left(\frac{d}{b}\right)^2 + 1}\right\},$$

which then further reduces to:

$$M_{1a,2a,2b} = M_{1a,2b} + M_{1a,2a} = \frac{\mu_0 b}{\pi}\sqrt{\left(\frac{b}{d}\right)^2 + 1} \cong \frac{\mu_0 b}{\pi},$$

for d<<b. Thus, it can be seen that the mutual inductance between $L_{1a}$ and the dipole made up of $L_{2a}$ and $L_{2b}$ is virtually independent of the gap between the inductors. The final step to analyzing the mutual inductance between the mirror image resonators of the present invention is to determine the mutual inductance ($M_{1b,2a,2b}$) between inductor $L_{1b}$ and the dipole made up of $L_{2a}$ and $L_{2b}$. This mutual inductance is given by exactly the same equation as the mutual inductance for $L_{1a}$ and the dipole of $L_{2a}$ and $L_{2b}$, except that is of opposite sign:

$$M_{1a,2a,2b} = -\frac{\mu_0 b}{\pi},$$

for d<<b, because the current through $L_{1b}$ flows in a direction opposite to $L_{1a}$. Superimposing $L_{1b}$ and the dipole onto the structure in FIG. 33c results in the mirrored resonator topology of the present invention as illustrated in FIG. 33d. Thus, the mutual inductance between the mirrored resonators is given by:

$$M_{1a,1b,2a,2b} = \frac{\mu_0 b}{\pi} - \frac{\mu_0 b}{\pi} = 0.$$

Thus, the mutual inductance between the mirrored resonators of the present invention is virtually zero for inductive elements having a length relatively larger than the spacing between the resonators.

As previously mentioned, the foregoing analysis presumes that the inductive elements have zero width. It is the width of the elements that provides a sufficient amount of mutual inductance for the mirrored resonator structure to achieve optimal coupling. Nevertheless, the majority of the induced currents that increase with frequency cancel each other out to produce the benefit of the circuit. It should be pointed out that the mutual inductance between the resonators can also be controlled by the degree to which the inductive elements are or are not parallel with one another. As one of the inductive elements of a resonator is rotated with respect to the other, the degree of cancellation will decrease accordingly.

Figure 32B:
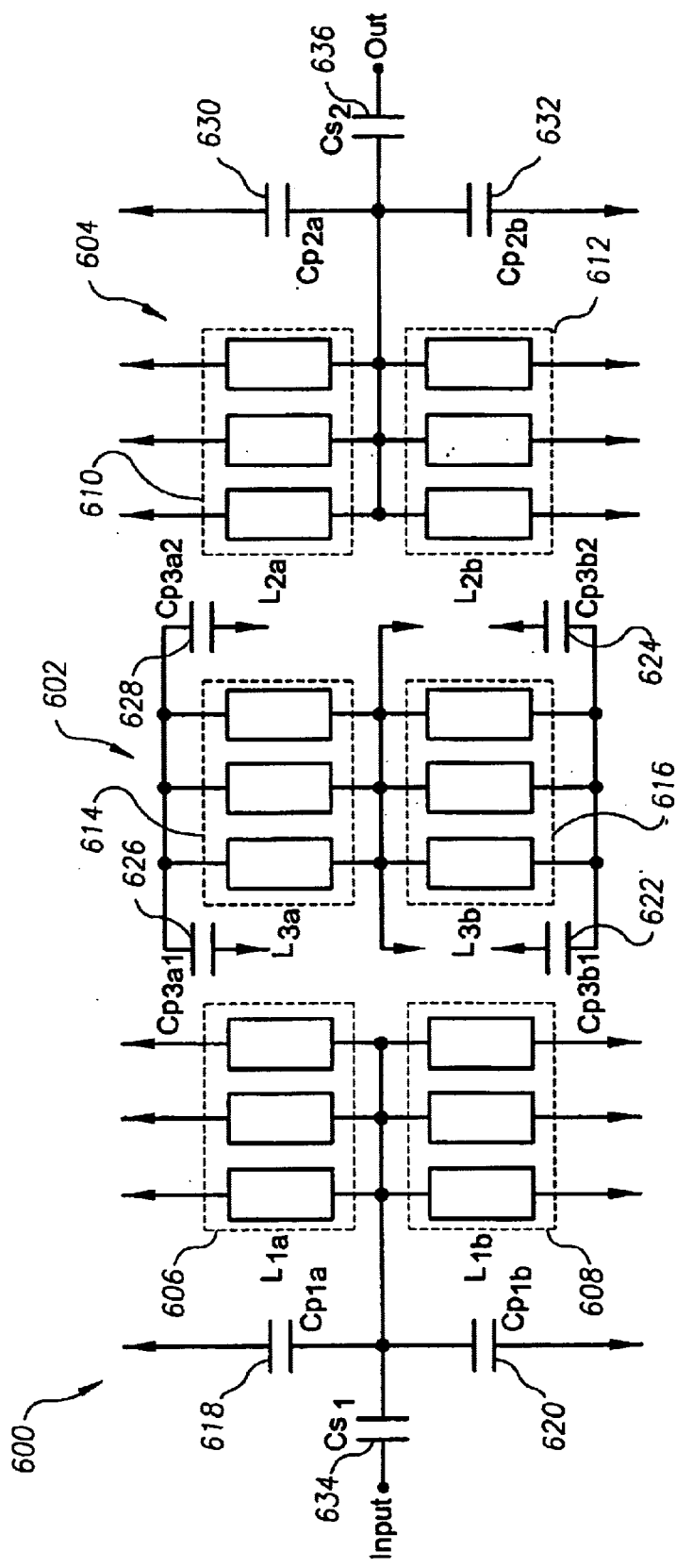
FIG. 32b is an embodiment of the mirror image topology as applied to the parallel tuned resonator having more than two cascaded resonators employing multiple strips in parallel for each of the inductance elements of the resonators.

FIG. 32b illustrates a preferred embodiment of the mirrored resonator topology. The transfer function for the circuit of FIG. 32b is of a higher-order than the circuit of FIG. 32a by the addition of a third resonator 602. Resonator 602 has a structure that is inverted with respect to resonators 600 and 604, but the structure is equivalent in operation. Thus, resonators 600 and 604 could also be inverted in this manner, as illustrated by resonators 600i and 604i in FIG. 32c. This symmetrical operation provides additional degrees of freedom with respect to the physical layout of the circuit. The embodiment of FIGS. 32b and 32c further illustrate the implementation of the inductor elements $L_{1a}$ 606, $L_{1b}$ 608, $L_{2a}$ 610, $L_{2b}$ 612, $L_{3a}$ 614 and $L_{3b}$ 616 as three micro-strips in parallel, each providing an effective inductance of about 1/3 of the inductance of one of the parallel micro-strips. The total effective inductance for each of the three resonators is then reduced by more than an additional 50% and thus is less than 1/6 of the L for each individual micro-strip.

Figure 32C:
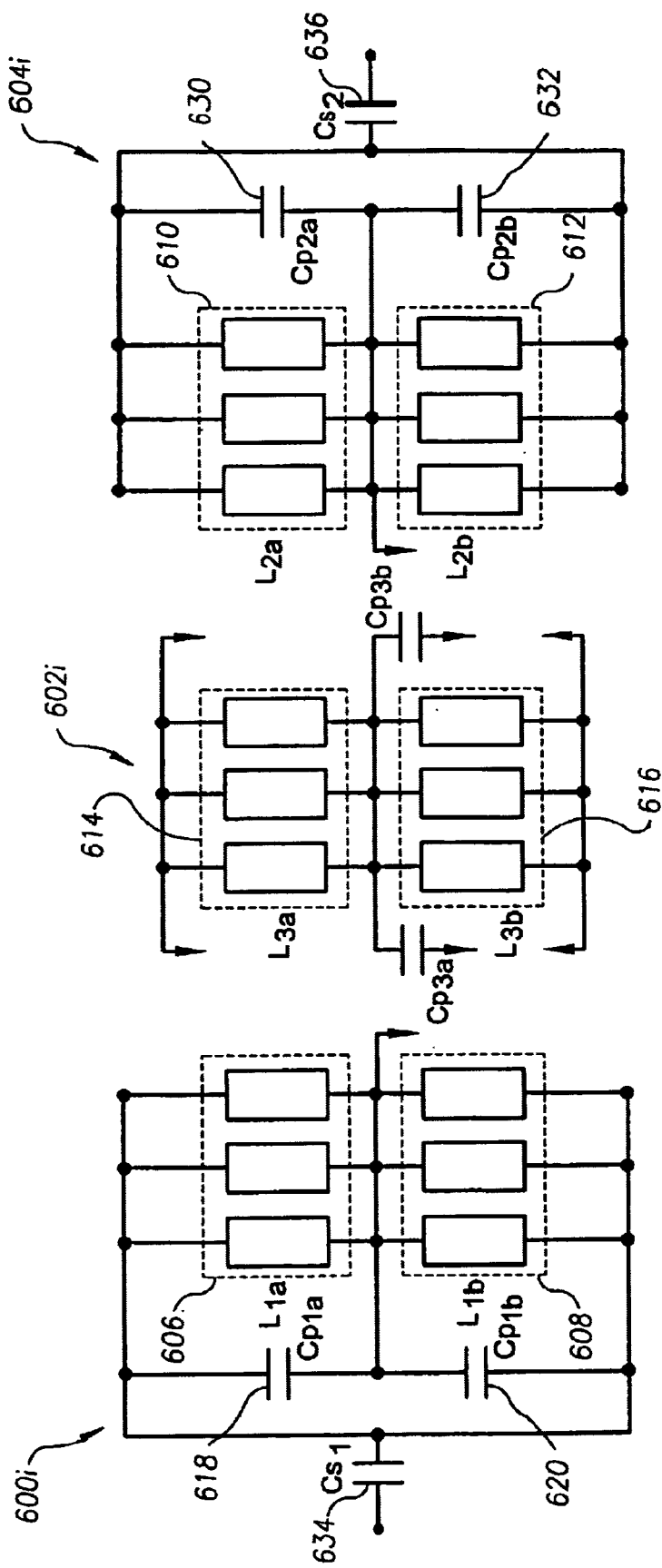
FIG. 32c illustrates the symmetrical nature of the mirror image topology, as applied to the cascaded resonator of FIG. 32b.

It should also be noted that the shunt capacitors for each resonator for the embodiments of FIGS. 32a–c (e.g. $C_{P1a}$ 618 and $C_{P2}$ 620 for resonator 600) are also in parallel, and thus their values add together to obtain the total effective shunt capacitance for each resonator. Implementing each of the shunt capacitors as 2 or more capacitors in parallel provides the additional benefit of placing the parasitic resistance and inductance for each capacitor in parallel, which serves to reduce them significantly, thereby improving the performance of the filter circuit.

Figure 34A:
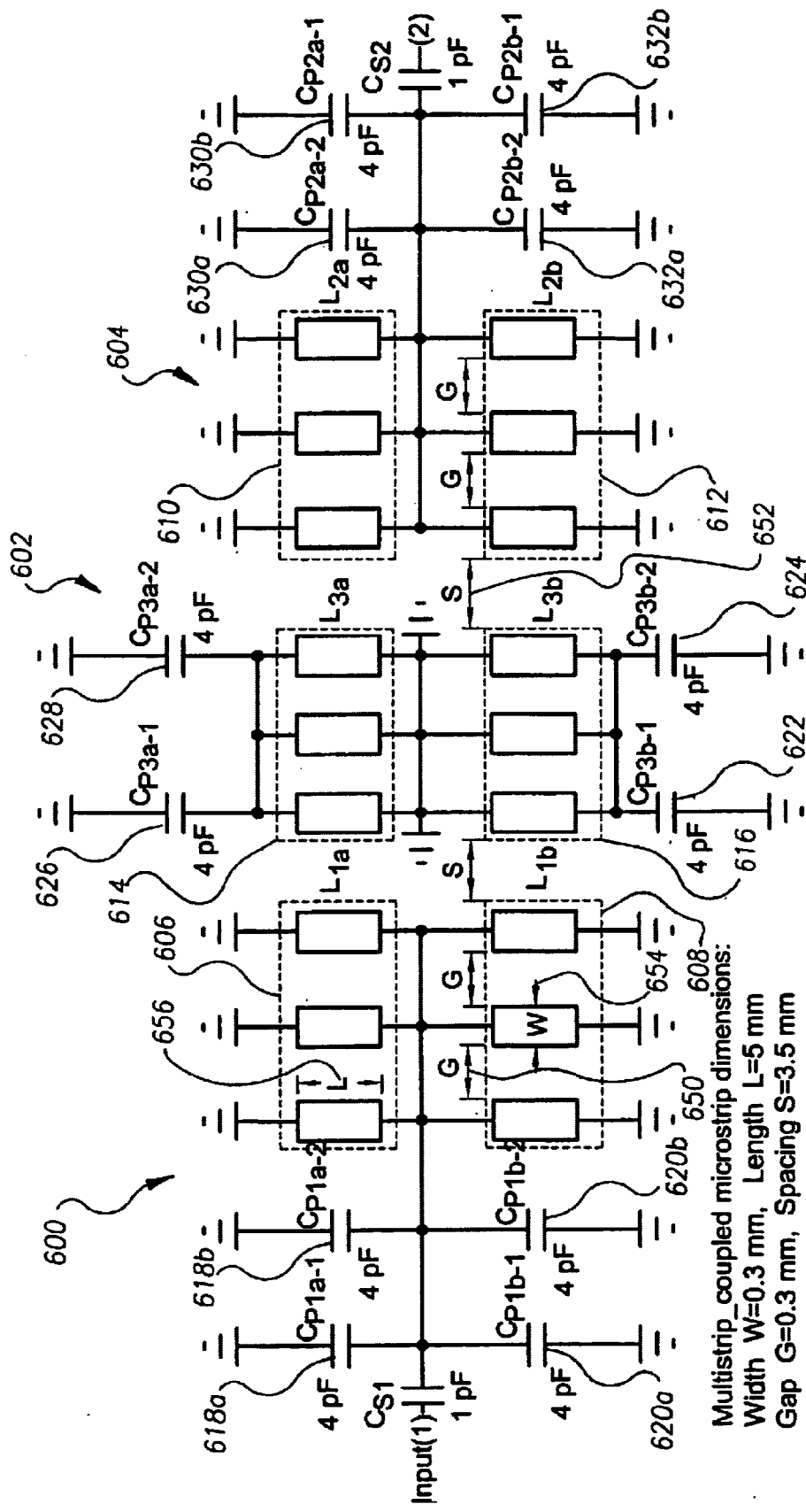
FIG. 34a illustrates an embodiment of the mirror image topology as applied to the cascaded circuit of FIG. 32b, implemented using printed circuit board process technology and having component values to achieve a 1015.75 MHz narrow band pass filter.

A practical implementation of the mirrored resonator topology is shown in FIG. 34a. This is the same circuit as that disclosed in conjunction with FIG. 32b. Like components are similarly numbered between the two figures. The effective inductance for each of the resonators 600, 602 and 604 is 1.5 nH. The center frequency is 1015.75 MHz, with a pass band of 30 MHz. Actual values for the capacitance and inductance elements are disclosed, including the length, width and gap measurements for the inductance elements, including the gap G 650 between the parallel micro-strips, the width W 654 of the micro-strips, the length L 656 of the micro-strips and the spacing S 652 between the resonators. Resonators having effective inductances well below 0.5 nH can be achieved using the mirrored resonator topology of the present invention. Of course, as the resolution of the manufacturing process becomes finer, the minimum effective inductance for the resonators will decrease accordingly.

Figure 34B:
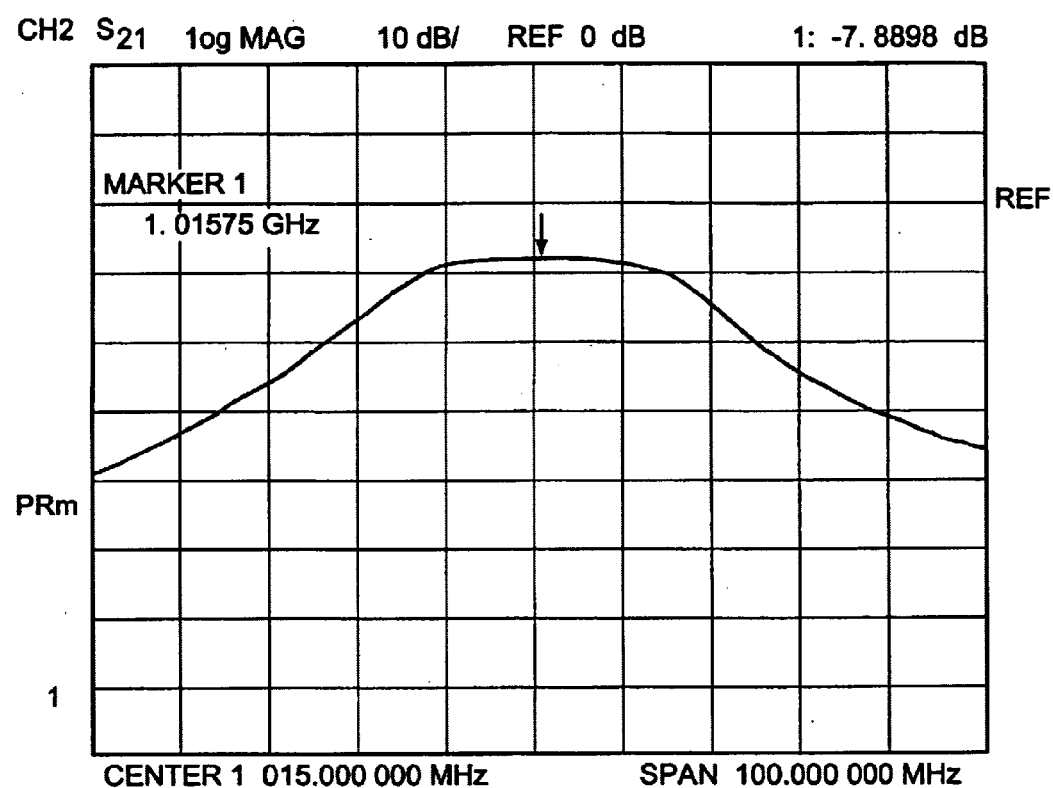
FIG. 34b is the measured response for the resonator of FIG. 34a using a broad scale for both frequency (span of 100 MHz) and attenuation (10 dB/div.).
Figure 34C:
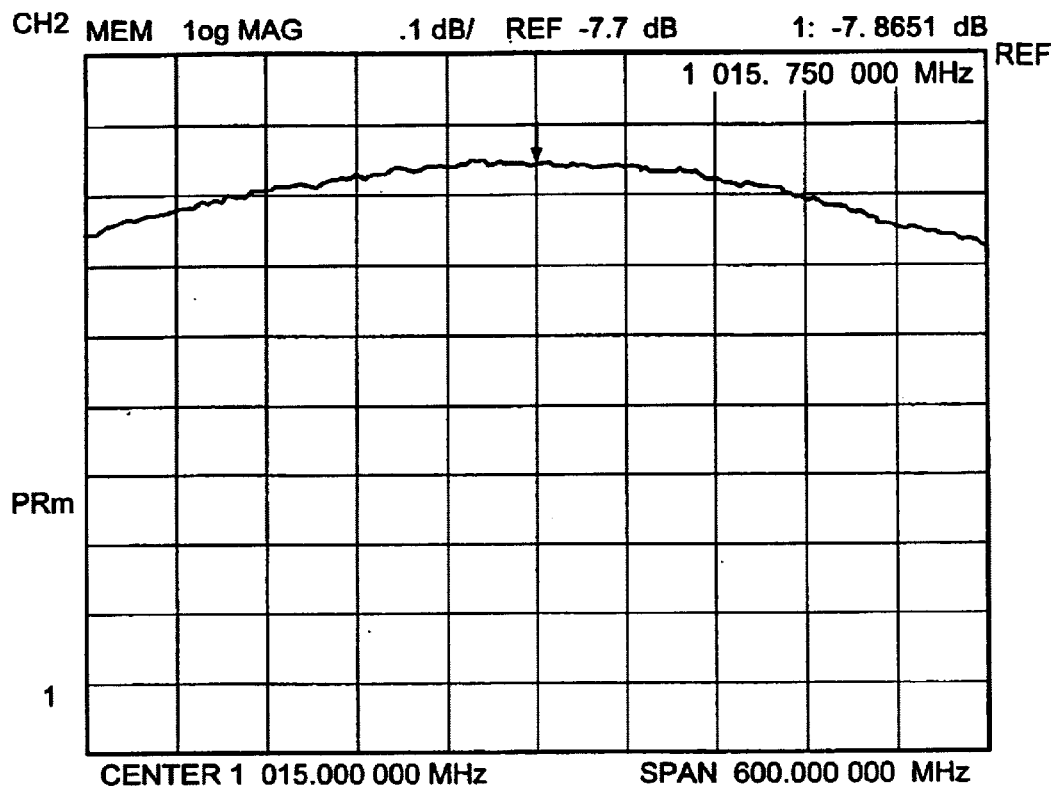
FIG. 34c is the measured response for the resonator of FIG. 34b using a smaller scale for both frequency (span of 6 MHz) and attenuation (0.1 dB/div.).
Figure 34D:
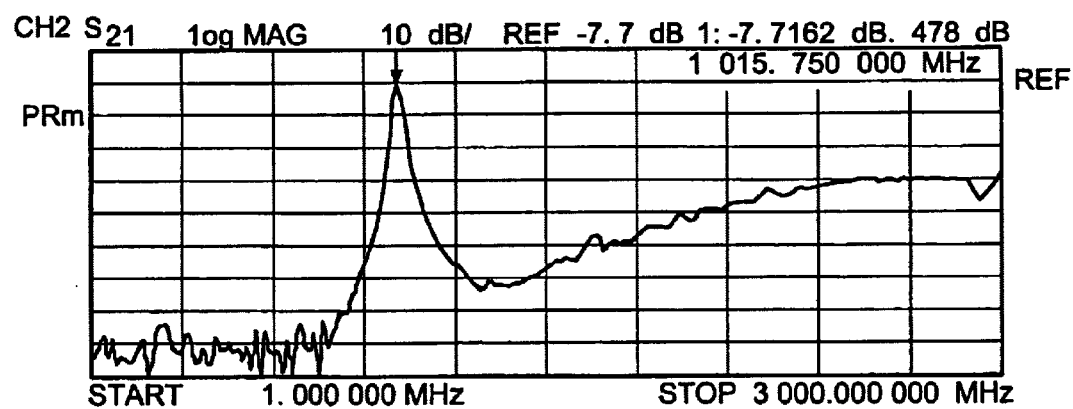
FIG. 34d is the measured response for the resonator of FIG. 34a using a very broad scale for both frequency (span of 3 GHz) and attenuation (10 dB/div.).
Figure 34E:
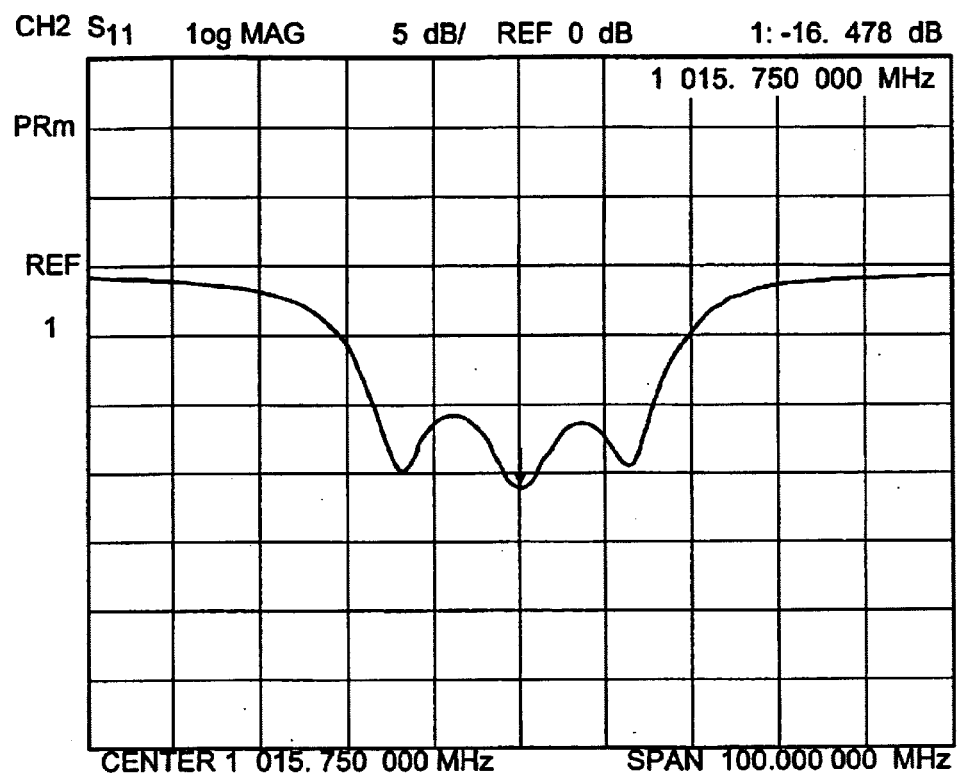
FIG. 34e is the measured return loss for the resonator of FIG. 34a using a scale a span of 100 MHz and attenuation scale of (5 dB/div.).

FIGS. 34b, 34c and 34d illustrate an actual measured transfer function for the circuit of FIG. 34a. The frequencies at the 3 dB points are 1000 MHz and 1030 MHz respectively, and thus the $Q_L$ of the circuit is 34, for a fractional bandwidth of 3%. FIG. 34e shows the measured return loss for the circuit of FIG. 34a.

Figure 31:
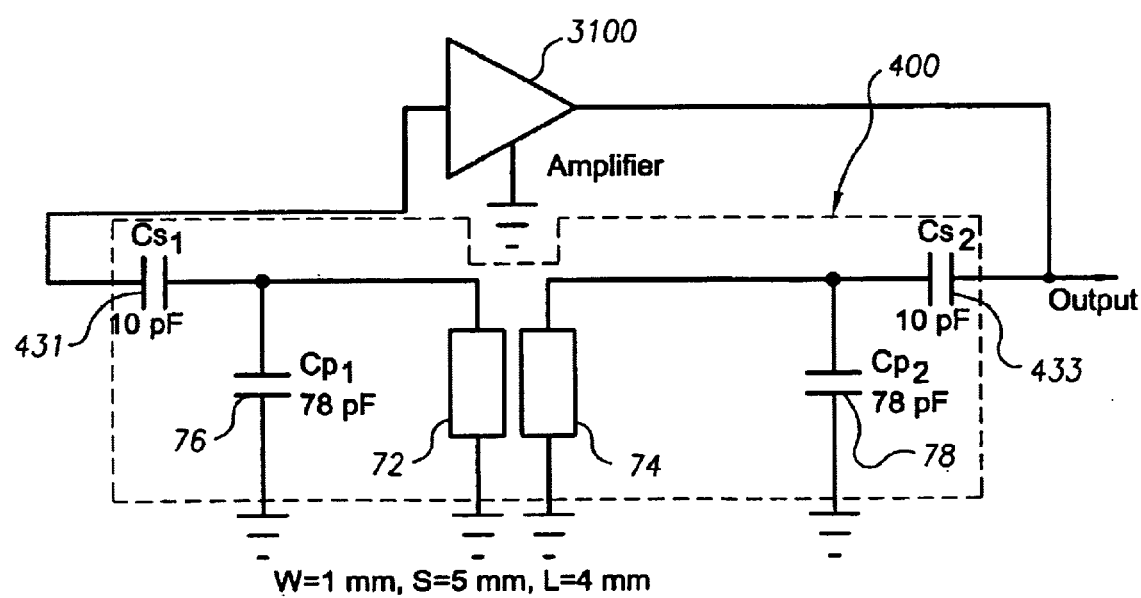
FIG. 31 is an example of an embodiment employing the parallel tuned resonator circuit of FIG. 10a to achieve a 400 MHz Oscillator.

In addition to filtering applications, the present invention can be utilized in different applications where its unique features, namely its frequency discrimination ability combined with low insertion loss, can provide significant advantages. An example of such application is the use of the present invention in the feedback path of oscillators, as shown in FIG. 31. Connecting the input/output ports of the coupled resonator filter 400 to the input/output ports of an RF amplifier 3100 will provide a feedback path from the output of the amplifier 3100 to its input, effectively closing the loop around the amplifier 3100. The oscillation will occur at the frequency where the phase shift around the loop is 0 degrees (or multiples of 360 degrees) provided that the loop gain is greater than one (i.e. the gain of the amplifier 3100 is greater than the insertion loss of the feedback path). The phase shift of the coupled resonators structure 400 is 180 degrees on center frequency, and using an inverting amplifier (with 180 degrees of internal phase shift) will provide a total phase shift of 360 degrees, thus meeting the conditions necessary for oscillation. A circuit utilizing coupled resonators with 0 degrees phase shift (for instance, by rotating the input 72 or output 74 micro-strip by 180 degrees relative to the other), followed by a non-inverting amplifier for amplifier 3100 will also meet the conditions for oscillation.

The narrow bandwidth of the magnetically coupled resonators (i.e. its high $Q_L$) is associated with steep phase slope in the vicinity of the center frequency. This steep phase slope in the feedback loop will improve the phase noise performance of the oscillator of FIG. 31.

What is claimed is:

1. A circuit comprising:
   a first resonator magnetically coupled to a second resonator, said first and second resonator each further comprising:
      a first capacitor having a first capacitance and a first inductive element having a first inductance connected between a signal line and ground;
      a second capacitor having a second capacitance and a second inductive element having a second inductance connected between said signal line and ground so that current flowing through said first and second inductive elements are substantially in opposite directions;
      wherein said first and second inductive elements are magnetically coupled; and
      wherein the product of said first capacitance and said first inductance is substantially equal to the product of said second capacitance and said second inductance.

2. The circuit of claim 1 wherein said signal line of said first resonator is for transmitting an input signal to said first resonator and said signal line of said second resonator is for transmitting an output signal from said circuit to a load, said input signal being coupled to said first resonator through a first coupling capacitor in series with said first resonator and said output signal coupled to said load through a second coupling capacitor in series with said second resonator.

3. The circuit of claim 1 wherein said first and second inductances and said first and second capacitances are of identical values of inductance and capacitance respectively.

4. The circuit of claim 1 wherein the physical proximity and orientation of the first and second inductive elements results in effective inductance that is smaller than each of said first and second inductances.

5. The circuit of claim 1 wherein one or more of said first and second inductive elements of each of said first and second resonators are comprised of a bulk inductance formed by a metal line residing on a substantially nonconductive surface.

6. The circuit of claim 5 wherein said one or more of said inductive elements is formed of two or more metal lines connected in parallel to one another.

7. The circuit of claim 1 wherein one or more of said first and second capacitors are formed of two or more capacitors in parallel to reduce the inductive or resistive parasitic effects associated with said first and second capacitors.

8. The circuit of claim 1 wherein said first and second inductive elements of said first resonator are magnetically coupled to the first and second inductive elements of said second resonator.

9. A circuit comprising:
two or more resonators magnetically coupled to each other in cascade, said two or more resonators each further comprising:
a first capacitor having a first capacitance and a first inductive element having a first inductance coupled between a signal line and ground;
a second capacitor having a second capacitance and a second inductive element having a second inductance coupled between said signal line and ground so that current flowing through said first and second inductive elements are substantially in opposite directions; and
wherein said first and second inductive elements are magnetically coupled.

10. The circuit of claim 9 wherein said first and second inductances and said first and second capacitances of each of said two or more resonators are of identical values of inductance and capacitance respectively.

11. The circuit of claim 9 wherein the physical proximity and orientation of the first and second inductive elements results in effective inductance that is smaller than each of said first and second inductances.

12. The circuit of claim 9 wherein one or more of said first and second inductive elements of each of said two or more resonators are comprised of a bulk inductance formed by a metal line residing on a substantially nonconductive surface.

13. The circuit of claim 12 wherein said one or more of said inductive elements is formed by two or more metal lines connected in parallel to one another.

14. The circuit of claim 9 wherein one or more of said first and second capacitors are formed of two or more capacitors in parallel to reduce the inductive or resistive parasitic effects associated with said first and second capacitors.

15. A method of maintaining high loaded Q and optimal coupling for a parallel-tuned series resonant circuit having a resonant frequency selected over an extended frequency range, the circuit having two or more tuned resonators magnetically coupled to one another in cascade, each of the resonators comprising an inductive element connected between a signal line and ground and having an inductance of L, and a capacitance element connected between the signal line and ground and having a capacitance of C, said method comprising the steps of:
implementing the inductive elements each as a bulk inductance formed by metal lines over a substantially nonconductive surface;
canceling out substantially the mutually induced currents between the two or more resonators by setting the physical proximity and orientation of the metal lines of said inductive elements in a manner that reduces the respective inductances of said inductive elements;
selecting an increased value of C so as to achieve resonance with the reduced value of L at said resonant frequency; and
controlling the coupling between the two or more resonators by setting the physical distance between the two or more resonators in proportion to the size of the inductive elements.

16. The method of claim 15 wherein said canceling step is achieved by setting the orientation of the metal lines in a mirrored configuration.

17. The circuit of claim 9 wherein said signal line of a first of said two or more resonators is for transmitting an input signal to said first resonator; and said signal line of a second of said two or more resonators is for transmitting an output signal from said circuit to a load, said input signal being coupled to said first resonator through a first coupling capacitor in series with said first resonator and said output signal coupled to said load through a second coupling capacitor in series with said second resonator.

18. The circuit of claim 9 wherein said first and second inductive elements of each of said two or more resonators are magnetically coupled to the first and second inductive elements of each of the two or more resonators with which it is coupled in cascade.

19. A circuit comprising:
two or more resonators magnetically coupled to each other in cascade, said two or more resonators each further comprising:
a first capacitor having a first capacitance and a first inductive element having a first inductance coupled between a signal line and ground;
a second capacitor having a second capacitance and a second inductive element having a second inductance coupled between said signal line and ground so that current flowing through said first and second inductive elements are substantially in opposite directions; and
wherein said first and second inductive elements of each of said two or more resonators are romantically coupled to the first and second inductive elements of each of the two or more resonators with which it is coupled in cascade.

20. A circuit comprising:
a first resonator magnetically coupled to a second resonator, said first and second resonator each further comprising:
a first capacitor having a first capacitance and a first inductive element having a first inductance connected between a signal line and ground;
a second capacitor having a second capacitance and a second inductive element having a second inductance connected between said signal line and ground so that current flowing through said first and second inductive elements are substantially in opposite directions; and
wherein the product of said first capacitance and said first inductance is substantially equal to the product of said second capacitance and said second inductance; and
wherein said first and second inductive elements of said first resonator are magnetically coupled to the first and second inductive elements of said second resonator.

* * * * *